United States Patent [19]
Arai et al.

[11] Patent Number: 5,972,783
[45] Date of Patent: Oct. 26, 1999

[54] METHOD FOR FABRICATING A SEMICONDUCTOR DEVICE HAVING A NITROGEN DIFFUSION LAYER

[75] Inventors: Masatoshi Arai, Nara; Mizuki Segawa; Toshiki Yabu, both of Osaka, all of Japan

[73] Assignee: Matsushita Electric Industrial Co., Ltd., Osaka, Japan

[21] Appl. No.: 08/796,710

[22] Filed: Feb. 6, 1997

[30] Foreign Application Priority Data

Feb. 7, 1996 [JP] Japan ................................ 8-020802
Jul. 12, 1996 [JP] Japan ................................ 8-183004
Dec. 6, 1996 [JP] Japan ................................ 8-326507

[51] Int. Cl.$^6$ ...................... H01L 21/336; H01L 21/223; H01L 21/331; H01L 21/265
[52] U.S. Cl. .................. 438/513; 438/525; 438/528; 438/775; 438/776; 438/369
[58] Field of Search .................................. 438/513, 525, 438/528, 529, 769, 776, 777, FOR 158, 775, 369

[56] References Cited

U.S. PATENT DOCUMENTS

| 3,615,875 | 10/1971 | Morita et al. | |
|---|---|---|---|
| 4,559,696 | 12/1985 | Anand et al. | 29/576 |
| 4,870,245 | 9/1989 | Price et al. | 438/776 |
| 5,369,297 | 11/1994 | Kusonoki et al. | 257/411 |
| 5,382,533 | 1/1995 | Ahmad et al. | 437/24 |
| 5,514,902 | 5/1996 | Kawasaki et al. | 257/607 |
| 5,516,707 | 5/1996 | Loh et al. | 438/525 |
| 5,557,129 | 9/1996 | Oda et al. | 257/345 |
| 5,750,435 | 5/1998 | Pan | 438/525 |
| 5,786,254 | 7/1998 | Hao et al. | 438/769 |
| 5,882,974 | 3/1999 | Gardner et al. | 438/528 |
| 5,885,886 | 3/1999 | Lee | 438/528 |

FOREIGN PATENT DOCUMENTS

| 2 709 599 | 3/1995 | European Pat. Off. |
|---|---|---|
| 19517002 | 5/1995 | Germany . |
| 60-170259 | 9/1985 | Japan . |
| 61-255069 | 11/1986 | Japan . |
| 63-062379 | 3/1988 | Japan . |
| 1-272161 | 10/1989 | Japan . |
| 7-030113 | 1/1995 | Japan . |

OTHER PUBLICATIONS

Nuclear Instruments and Methods in Physics Research "Application of Nitrogen Implantation to ULSI" Takashi Murakami, Takashi Kuroi, Yoji Kawasaki, Masahide Inuishi, Yasuji Matsui, Akihiko Yasuoka, vol. 121, No. 1, Jan. 1997, pp. 257–261.

Codella et al., "Submicron IGFET Device With Double Implanted Lightly Doped Drain/Source Structure", IBM Technical Disclosure Bulletin, vol. 26, No. 12, May 1984, pp. 6584–6586.

Primary Examiner—Mary Wilczewski
Attorney, Agent, or Firm—McDermott, Will & Emery

[57] ABSTRACT

An element isolator is formed in a silicon substrate. A gate oxide film and a gate electrode are formed overlying the silicon substrate. Subsequently, a four-step large-tilted-angle ion implant is performed in which ions of nitrogen are implanted at an angle of tilt of 25 degrees, to form an oxynitride layer at each edge of the gate oxide film and to form a nitrogen diffusion layer in the silicon substrate. This is followed by formation of a lightly-doped source/drain region by means of impurity doping. A sidewall is formed on each side surface of the gate electrode, which is followed by formation of a heavily-doped source/drain region by impurity doping. The present invention provides an improved semiconductor device having high-performance, highly-reliable MOS field effect transistors and a method for fabricating the same.

25 Claims, 24 Drawing Sheets

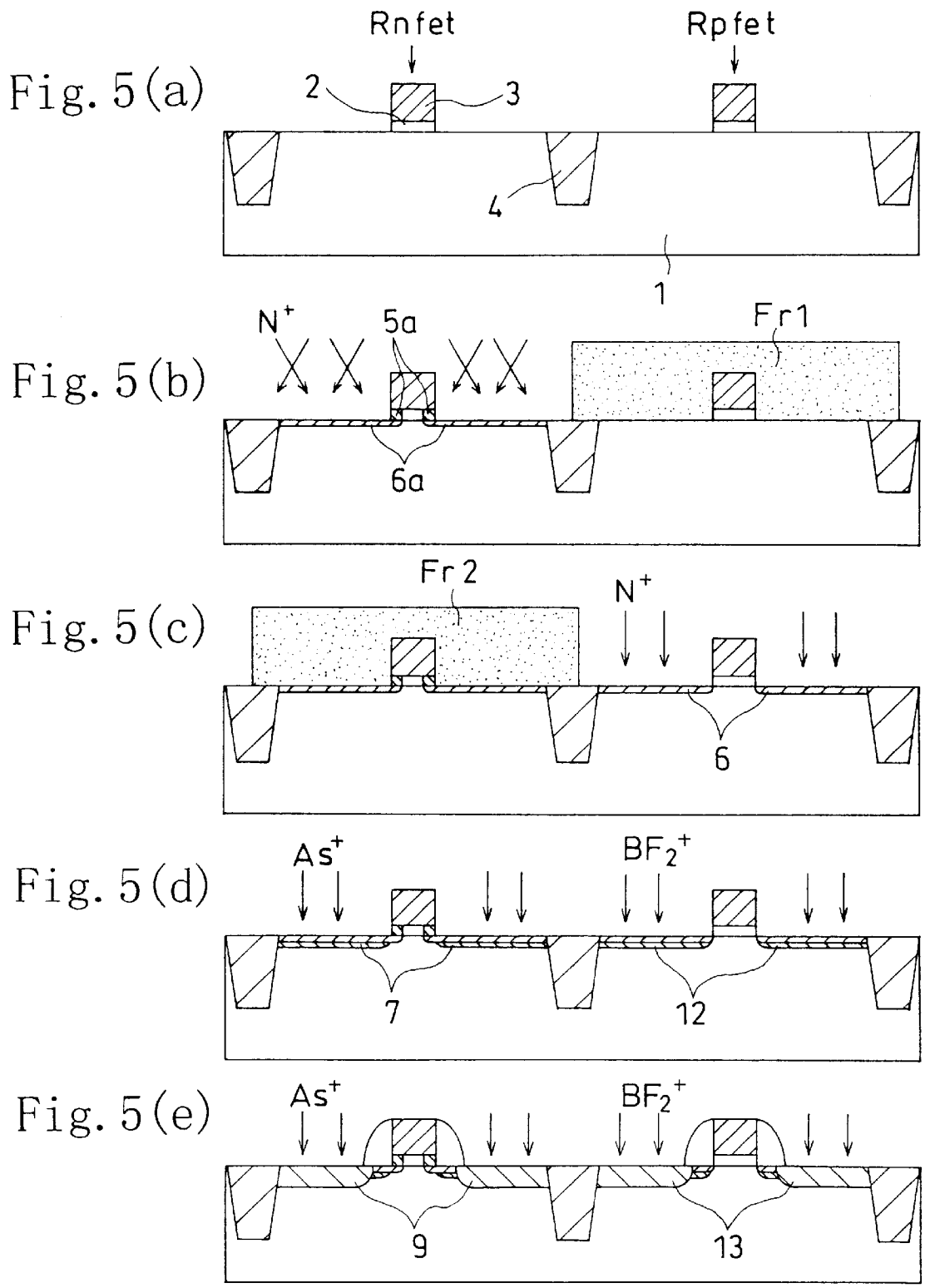

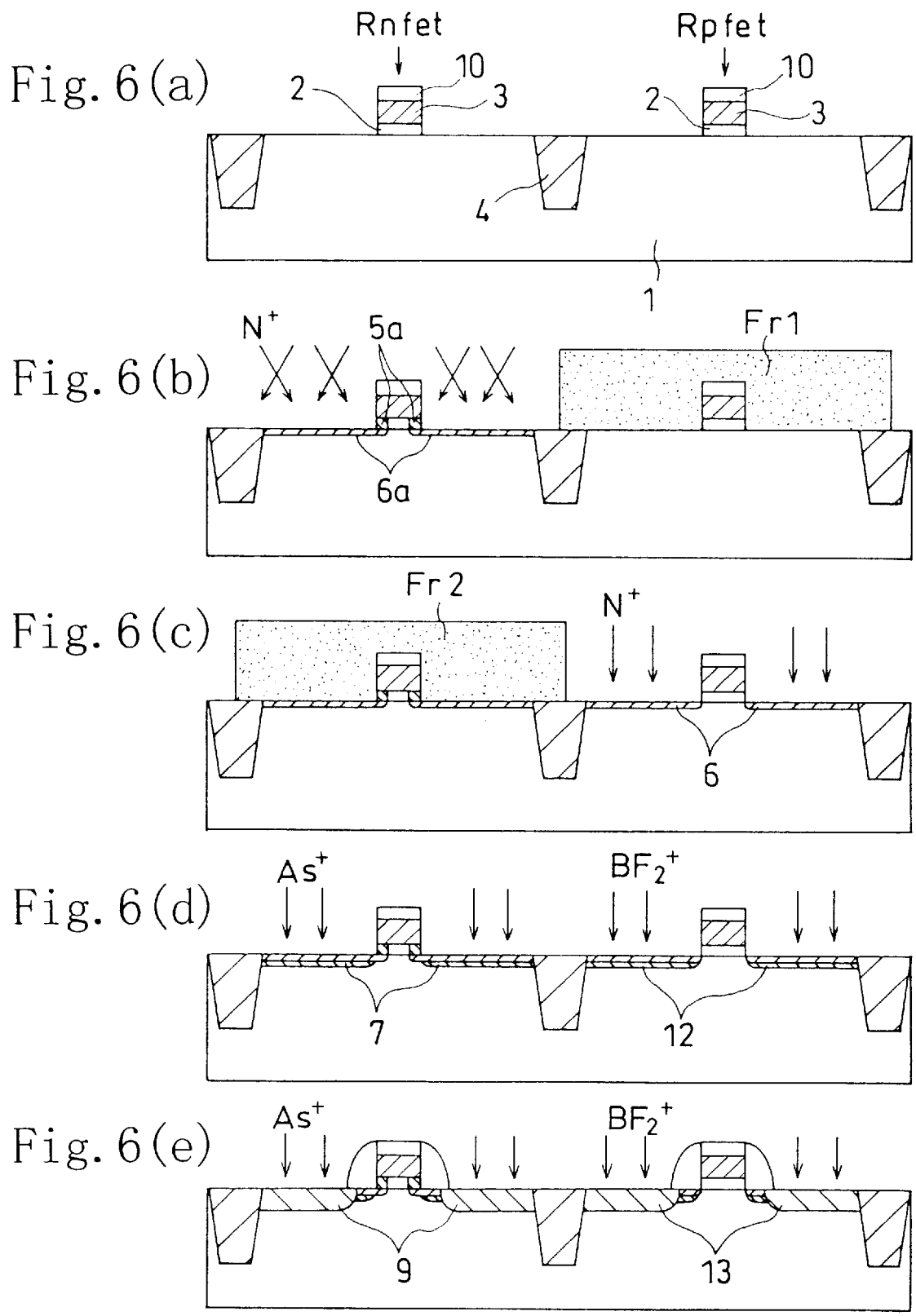

Fig. 9

- gate patterning
- S/D extension implant. (BF2$^+$, 10keV, 1×10$^{14}$cm)
- n-pocket implant.
- sidewall formation (120nm)
- S/D implant. for pMOSFET
- RTP(900°C, 10sec., in an NH3 ambient)
- RTA(1000°C, 10sec., in an N2 ambient)
- Ti deposition
- 1st. step RTA/wet etching/2nd. step RTA
- IMD formation (below 750°C annealing)

METHOD FOR FABRICATING A SEMICONDUCTOR DEVICE HAVING A NITROGEN DIFFUSION LAYER

BACKGROUND OF THE INVENTION

The present invention relates to semiconductor devices having thereon MIS-type field effect transistors and bipolar transistors, and to a method of fabricating such semiconductor devices. The present invention pertains particularly to ways of increasing the performance and reliability of semiconductor devices by providing improved structures for impurity diffusion layers and gate insulation films.

In a conventional MIS-type field effect transistor in which a gate electrode is formed on a semiconductor substrate with a gate oxide film sandwiched therebetween and impurity diffusion regions (source and drain regions) are formed on opposite sides of the gate electrode, the gate oxide film plays a very important role. There have been strong demands for improved semiconductor devices which are element-miniaturized, which can be driven at low power and which can operate at high speed. However, to meet such requirements while at the same time maintaining high reliability, it is necessary to sophisticatedly contrive not only the physical dimensions of gate oxide films (e.g., the film thickness) but also the structure thereof.

Various techniques for providing improved structures for gate oxide films have been known in the art. In one such technique with a view to improving device reliability, gate oxide layer degradation in function (threshold voltage variation) due to hot carriers of CMOS devices (in particular, hot carriers of nMOS transistors), is controlled, and an oxynitride layer is formed in a gate oxide film. For example, a technique has been reported in a paper (IEDM Tech. Dig. pp. 325–328, IEEE 1993), in which after formation of a gate electrode nitrogen ions are implanted into the gate electrode and into the semiconductor substrate, and the implanted nitrogen is diffused by an annealing treatment to form an oxynitride layer in the gate oxide film. This method is used as an example for describing the steps of forming an oxynitride layer.

In a process step of FIG. 22(a), element isolator 4 is formed in a portion of silicon substrate 1. Thereafter, an oxide film is formed on silicon substrate 1 within an active region surrounded by element isolator 4, and a polysilicon film is deposited. Both the oxide film and the polysilicon film are patterned using photolithography and dry etching, to form gate oxide film 2 and gate electrode 3.

Next, in a process step of FIG. 22(b), an ion implant is carried out in which ions of nitrogen (N+) are implanted, from above the substrate, into gate electrode 3 and into silicon substrate 1 within the active region. The implanted nitrogen ions are then diffused by an annealing treatment, to simultaneously form oxynitride layer 5 in gate oxide film 2, and nitrogen diffusion layer 6 in a near-surface area of silicon substrate 1.

In a process step of FIG. 22(c), ions of arsenic (As+) of low concentration are implanted at approximately right angles to the surface of silicon substrate 1, to form lightly-doped n-type source/drain region 7 at a near-surface area of silicon substrate 1.

In a process step of FIG. 22(d), after deposition of a rather thick silicon oxide film on the substrate an etch back process is carried out to form sidewall 8 on each side surface of gate electrode 3. An ion implant is then performed in which ions of arsenic (A+) of high concentration are implanted at approximately right angles to the substrate, to form heavily-doped n-type source/drain region 9 outside the source/drain region 7.

In so-called "dual gate CMOS device", a gate electrode of an nMOS field effect transistor is n-doped with arsenic while a gate electrode of a PMOS field effect transistor is p-doped with boron.

The above-described technique makes it possible to form miniaturized, low-voltage, fast LDD-type nMOS field effect transistors, and the formation of oxynitride layer 5 in gate oxide film 2 of the transistor controls hot carrier degradation. The aforesaid paper shows that as the dosage of nitride is increased such degradation becomes more controllable. Particularly, nMOS field effect transistors, in which degradation in characteristic caused by hot electron (increase in the threshold voltage) is a critical problem, get much benefit from such hot carrier degradation control.

Additionally, there is produced the effect on the side of the pMOS field effect transistor. More specifically, owing to the formation of the oxynitride layer in the gate oxide film, boron ions are controlled so as not to penetrate to a surface channel region in the substrate, as a result of which the characteristic of transistor is not ill-affected.

The above-described conventional technique, however, suffers some drawbacks. For example, degradation in transistor performance such as transistor drive power drop, was observed to occur due to the formation of oxynitride layer 5 shown in FIG. 22(d). Such a phenomenon may be explained as follows. Because of the formation of oxynitride layer 5, impurity diffusion such as arsenic diffusion and boron diffusion in gate electrode 3 is controlled too much and, as a result, the dual gate structure becomes unable to exhibit its advantages. In addition, there is produced an increase in resistance by gate electrode depletion. Further, it has been reported that the formation of an oxynitride layer in a gate oxide film of a pMOS field effect transistor, decreases transistor mutual conductance for unknown reasons.

Where the characteristics of diffusion layers of transistors are considered, there are still problems other than the aforesaid ones.

In a self-align-silicidation process which is a typical technique for reduction of the resistance of gates and source/drain diffusion layers indispensable to high-speed, high-integration-level MOS devices, it becomes difficult to form a shallow junction when trying to form a stable, low-resistance silicide film to a great thickness in consideration of the fact that silicon (diffusion layer) is consumed at the time of silicide formation. The concentration of impurity at the silicide interface drops and, as a result, parasitic resistance increases. The drain current then decreases.

Such a problem becomes significant when, especially in a surface channel type pMOSFET, ions of $BF_2$ (boron fluoride) are implanted to form a diffusion layer of the p-type. This gives rise to a new problem. FIG. 23 is a graph showing the boron SIMS profiles of (a) a silicon substrate which has been implanted with $BF_2$ ions at an implant energy of 30 keV at a dosage of $2 \times 10^{15} cm^{-2}$ before being subjected to an activation annealing treatment at 1000 degrees centigrade for ten seconds and (b) a silicon substrate which has been implanted with B (boron) ions at an implant energy of 10 keV at a dosage of $2 \times 10^{15} cm^{-2}$ before being subjected to an activation annealing treatment at 1000 degrees centigrade for ten seconds.

The $BF_2$ implant is first described. Boron fluoride ($BF_2$) results from fluoride-boron bounding, which gives rise to dissociation, and there are created two impurity concentration peaks (see FIG. 23). Although the higher of these two peaks is located on the side of the substrate surface, the boron will make no contribution to forming a final diffusion layer, for the boron is present in an area that is silicided later. As a result, the concentration at a silicide/diffusion layer interface decreases from the diffusion layer's original concentration peak, so that the contact resistance of this portion increases. Further, in the case of the surface channel type transistor, when implanting impurities into a diffusion layer, a gate electrode is also implanted with the impurities. Therefore, it becomes necessary to pay attention to the penetration phenomenon in which the impurities penetrate from the gate electrode towards the substrate through a gate insulation film.

FIG. 24 shows the quasi-static C-V characteristic of the $BF_2$ (boron fluoride) implant (implant energy: 30 kev; dosage: $2 \times 10^{15} cm^{-2}$) and the B (boron) implant (implant energy: 10 keV; $2 \times 10^{15} cm^{-2}$). Although no penetration occurs in the case of the B implant, the waveform flat band voltage (Vfb) is 0.86 V. On the other hand, in the case of the $BF_2$ implant there is a slight shift and the Vfb is 0.88 V, from which it can be seen that somewhat penetration has occurred.

FIG. 25 shows the dependency of the implant dosage of boron and $BF_2$ upon the flat band voltage. For the case of the $BF_2$ implant, as the implant energy/dosage increases the shift of the flat band voltage likewise increases, and penetration becomes significant. If a technique, in which a greater implant energy and a greater dosage are used for the purpose of obtaining a greater impurity concentration at the interface between a post-silicide-formation silicide and a diffusion layer, is adopted, this accelerates impurity penetration from gate electrode towards substrate. As a result, it becomes hard to fabricate high-performance transistors.

The above-described problems have been discussed in terms of the $BF_2$ implant. Although boron penetration from gate electrode to substrate is eased, as compared with the $BF_2$ implant, in the case of the B implant (see FIGS. 24 and 25), a pn junction between source/drain region and substrate region is formed at a deep location, which is unsuitable for device miniaturization.

SUMMARY OF THE INVENTION

Bearing in mind the above-described problems associated with the prior art techniques, the present invention was made.

Therefore, it is a first object of the present invention to provide a high-performance, highly-reliable semiconductor device and method for fabricating the same by providing an improved structure for an oxynitride layer in a gate oxide film.

A second object of the present invention is directed to semiconductor elements which require the formation of shallow junctions. More specifically, diffusion is controlled or held low to create shallow junctions without increasing characteristic degradation and production costs, to provide high-performance devices with a microstructure. With a view to realizing both self-aligned-silicidation processing for silicidation of diffusion layers and dual gates having surface channel type pMOSFETs, the present invention intends to form low-resistance silicide films and shallow junctions while holding boron penetration as low as possible.

In order to achieve the first object of this invention, the following approach is taken. An oxynitride layer is formed at at least one edge of a gate oxide layer that is located on the drain side, thereby holding hot carrier degradation as low as possible and avoiding a drop in performance due to, for example, gate electrode depletion.

In order to achieve the second object of this invention, the following approach is taken. Nitrogen is doped into an impurity diffusion layer in such a way as not to cause defects in excess of the level of detection due to collisions of nitrogen and semiconductor atoms, to provide an improved concentration profile for diffusion layers while at the same time preventing the occurrence of characteristic degradation by defects.

The present invention provides a first semiconductor device, the first semiconductor device comprising:
 (a) an active region which is formed in a portion of the semiconductor substrate;
 (b) a gate oxide film which is formed overlying the active region;
 (c) a gate electrode which is formed overlying the gate oxide film;
 (d) a source region and a drain region which are formed by introducing an impurity into areas of the active region located on both sides of the gate electrode; and
 (e) an oxynitride layer which is formed at at least one of edges of the gate oxide film located on the side of the drain region.

Such arrangement provides benefits. One benefit is that since the oxynitride layer is formed only at one edge or both edges of the gate oxide film this prevents not only downward diffusion of the impurities present in the gate electrode but also transistor performance degradation duet to, for example, gate electrode depletion. Hot carrier degradation is caused by capture of hot carriers in a gate insulation film on the drain side. However, in the present invention the oxynitride layer is formed, in an effective manner, in the drain-side gate oxide film which is a cause of the hot carrier degradation, so that hot carrier reliability can be improved.

It is preferred that the oxynitride layer is formed at each edge of the gate oxide film in the first semiconductor device.

As a result of such arrangement, the functioning of controlling hot carrier degradation can be obtained without fail.

It is preferred that the first semiconductor device further comprises a nitrogen diffusion layer which is formed in at least a portion of the drain region of the source and drain regions.

Accordingly, the formation of the nitrogen diffusion layer in the semiconductor substrate prevents the occurrence of channeling at the ion implant time. This provides structures capable of forming source and drain regions with stability and the characteristic of transistor becomes stable.

Impurity concentration, particularly at a near-surface area of the semiconductor substrate, increases thereby reducing sheet resistance.

It is possible that in the first semiconductor device:
 (a) the semiconductor device includes an nMIS-type field effect transistor and a pMIS-type field effect transistor on the semiconductor substrate;
 (b) the MIS-type field effect transistor is the nMIS-type field effect transistor; and
 (c) the pMIS-type field effect transistor comprises:
  an active region which is formed in a portion of the semiconductor substrate;
  a gate oxide film which is formed overlying the active region;
  a gate electrode which is formed overlying the gate oxide film;
  a source region and a drain region which are formed by introducing an impurity into areas of the active region located on opposite sides of the gate electrode; and (d) no oxynitride layer is formed in the gate oxide film of the pMIS-type field effect transistor.

Owing to such arrangement the foregoing effects can be obtained in the nMIS-type field effect transistor. On the other hand, owing to the arrangement that no oxynitride layer is formed in the gate oxide film, a drop in mutual conductance can be avoided.

It is possible that the first semiconductor device further has on the gate electrode an over-gate insulation film which is patterned simultaneously with the gate electrode.

Accordingly, the top of the gate electrode is protected by the over-gate insulation film at the time of forming the oxynitride layer by an impurity ion implant or by introducing or doping nitrogen into an edge of the gate oxide film through thermal diffusion, plasma nitriding or the like. This makes it possible to prevent transistor performance degradation due to, for example, gate electrode depletion without fail.

The present invention provides a second semiconductor device which comprises:
 (a) a semiconductor substrate;
 (b) an impurity diffusion layer which is formed on the semiconductor device and which contains an impurity of a first conductivity type for carrier generation; and
 (c) a nitrogen diffusion layer which contains nitrogen, the nitrogen being doped into an area including at least a portion of the impurity diffusion layer, to such an extent that defects, caused by collisions with semiconductor atoms, do not exceed the level of detection.

Such arrangement presents benefits, one of which is that, since diffusion of the first conductivity type impurity contained in the impurity diffusion layer is controlled by the existence of the doped nitrogen, this allows areas of the impurity diffusion layer heavily doped with the first conductivity type impurity to concentrate on a near-surface area of the substrate. As a result, the sheet resistance of the impurity diffusion layer is considerably reduced, and various semiconductor devices, which are superior in characteristic, can be accomplished using such low-sheet-resistance impurity diffusion layers. Additionally, such an impurity diffusion layer suffers much less deficiency therefore preventing the characteristic of semiconductor device from being affected.

It is preferred that in the second semiconductor device the first conductivity type impurity has, in the impurity diffusion layer, a concentration distribution profile in which:
 the concentration of the first conductivity type impurity decreases from a maximum concentration point, located at a near-surface area of the semiconductor substrate, towards the bottom of the semiconductor substrate;
 the decreasing rate of the first conductivity type impurity concentration is growing greater from the maximum concentration point to a predetermined point located thereunder while the decreasing rate is growing smaller from the predetermined point inward.

Such arrangement provides an ideal concentration profile for the first conductivity type impurity in the impurity diffusion layer, whereby the aforesaid effects can be produced significantly.

It is possible that:
 the second semiconductor device further comprises a silicide film which is formed overlying the impurity diffusion layer;
 the first conductivity type impurity, contained in the impurity diffusion layer, has a maximum concentration point located immediately under an interface between the impurity diffusion layer and the silicide film.

Accordingly, as in the case of limiting diffusion by a $BF_2$ implant, the peak of impurity concentration is not located immediately under the substrate surface, but the impurity concentration peak is a little way off the substrate surface. Therefore, when the silicide film is formed the peak lies immediately under the silicide film. This considerably reduces the sheet resistance of the impurity diffusion layer and achieves a reduction of the junction leakage.

It is possible that:
 (a) the semiconductor device is a MIS-type field effect transistor;
 (b) the MIS-type field effect transistor comprises:
  a gate insulation film which is formed overlying an active region in the semiconductor substrate;
  a gate electrode which is formed overlying the gate insulation film;
  source and drain regions which contain an impurity of a first conductivity type and which are formed in areas of the active region located on opposite sides of the gate electrode;
  a channel region which contains an impurity of a second conductivity type and which is formed at an area of the active region defined between the source region and the drain region; and
 (c) the nitrogen diffusion layer is formed in an area including at least portions of the source and drain regions.

As a result of such arrangement, a semiconductor device with source and drain regions having a reduced sheet resistance can be formed.

It is possible that:
 (a) the second semiconductor device further comprises:
  sidewalls of an insulating material which are formed on both side surfaces of the gate electrode;
  extension regions which are formed between the source and drain regions and an area located immediately under the gate electrode and which contain an impurity of a first conductivity type at a lower concentration than the source and drain regions;
 (b) the nitrogen diffusion layer is formed extending also to each of the extension regions.

It is preferred that in the second semiconductor device an area of the source and drain regions, in which the concentration of the impurity for carrier generation is in excess of a predetermined value, is formed such that, at a portion thereof located adjacent to the channel region, the area more protrudes towards the channel region in a near-surface region of the semiconductor substrate while the area more sets back in the direction away from the channel region at a deeper region in the semiconductor substrate in comparison with a case in which nitrogen is absent.

As a result of such arrangement, transistor parasitic resistance is reduced and resistance to punch-through is enhanced thereby providing an improved function of controlling short channel effects and reducing parasitic capacitance. In other words, a structure suitable for fast operation and miniaturization is obtained.

It is possible that:
 (a) the second semiconductor device is a bipolar transistor comprising:
  an emitter region which is formed in a portion of an active region in the semiconductor substrate and which contains therein a second conductivity type impurity;

a base region which is formed in such a way so as to enclose the emitter region in the active region and which contains therein a first conductivity type impurity;

a collector region which is formed in an area including a portion under the base region in the active region and which contains therein a second conductivity type impurity;

(b) the nitrogen diffusion layer is formed in an area including at least a portion of the emitter region.

As a result of such arrangement, heavily-doped areas of the emitter region concentrate on a near surface area of the semiconductor substrate. This achieves a reduction in the emitter region resistance and bipolar transistors with a high current amplification rate can be fabricated.

It is possible that:

(a) the second semiconductor device is a bipolar transistor comprising:

an emitter region which is formed in a portion of an active region in the semiconductor substrate and which contains therein a second conductivity type impurity;

a base region which is formed in such a way so as to enclose the emitter region in the active region and which contains therein a first conductivity type impurity;

a collector region which is formed in an area including a portion under the base region in the active region and which contains therein a second conductivity type impurity;

(b) the nitrogen diffusion layer is formed in an area including at least a portion of the base region.

As a result of such arrangement, the base region comes to have a steep impurity concentration distribution. In addition, the base region comes to have a reduced thickness. Accordingly, a reduction of the base resistance is achieved and bipolar transistors with a high cutoff frequency can be fabricated.

The present invention provides a first method of fabricating a semiconductor device having a MIS-type field effect transistor, the first semiconductor device fabrication method comprising the steps of:

(a) a first step of forming on a semiconductor substrate an element isolator which encloses an active region;

(b) a second step of depositing on the active region an oxide film and a conductor film;

(c) a third step of patterning the oxide film and the conductor film to form a gate oxide film and a gate electrode for the MIS-type field effect transistor;

(d) a fourth step of forming an oxynitride layer by doping nitrogen into at least one of edges of the gate oxide film located on the drain formation side; and (e) a fifth step of forming a source region and a drain region for the MIS-type field effect transistor by introducing an impurity of a first conductivity type into areas of the active region located on opposite sides of the gate electrode.

In accordance with the first semiconductor device fabrication method, the aforesaid first semiconductor device is fabricated.

It is possible that in the first semiconductor device fabrication method:

the fourth step is performed after the third step and before the fifth step;

the oxynitride layer is formed by performing a large-tilted-angle implant of nitrogen ions from above said gate oxide film and gate electrode in which said nitrogen ions are implanted from directions including at least a direction with a tilt towards said drain region.

In accordance with the above-described method, the nitrogen ions are implanted at a large angle of tilt and the oxynitride layer is formed only at the edge of the gate oxide film. Even if a weaker implant energy and a lower dosage, in comparison with nitrogen implantation to the entirety of a gate electrode, are employed, formation of an oxynitride layer capable of sufficiently controlling hot carrier degradation can be made, and no gate electrode depletion occurs. Additionally, the amount of nitrogen that is implanted into a semiconductor substrate can be reduced, whereby crystallinity disturbance in active regions is reduced as low as possible, and therefore reliable, high-performance transistors can be formed.

It is possible that in the second semiconductor device fabrication method an implant of impurity ions is performed in the fourth step in which the impurity ions are implanted from directions including at least two directions or more including a direction with a tilt towards the drain region and a direction with a tilt towards the source region.

As a result of such arrangement, the oxynitride film is formed at each edge of the gate oxide film thereby making it possible to form transistors which suffer less hot carrier degradation.

It is possible that in the second semiconductor device fabrication method an implant of impurity ions is performed in the fourth step in which the impurity ions are implanted from a direction with a tilt angle of 10 degrees or more to a direction perpendicular to a surface of the semiconductor substrate in a cross section in parallel with the channel direction of the transistor.

As a result of such arrangement, it is ensured that the oxynitride layer is formed at an edge of the gate oxide film.

In the second semiconductor fabrication step the fourth step may be carried out by subjecting the semiconductor substrate to an anneal in an ambient of gas including at least nitrogen, e.g., in an ambient of ammonia gas or by generating plasmas in an ambient of gas including nitrogen.

It is possible that in the first semiconductor device fabrication method:

(a) in the first step, separate element isolators are formed enclosing a first active region for formation of an nMIS-type field effect transistor and a second active region for formation of a pMIS-type field effect transistor, respectively;

(b) in the second step, an oxide film and a conductor film are formed on each of the first and second active regions;

(c) in the third step, the oxide films and the conductor films are patterned so as to form gate oxide films and gate electrodes for the nMIS- and pMIS-type field effect transistors on the first and second active regions;

(d) in the fourth step, an oxynitride layer is formed at at least one of edges of the gate oxide film of the nMIS-type field effect transistor on the drain formation side; and (e) in the fifth step, areas on opposite sides of the gate electrode of the first active region are implanted with an impurity of a first conductivity type to form a source region and a drain region for the nMIS-type field effect transistor, and areas on opposite sides of the gate electrode of the second active region are implanted with an impurity of a second conductivity type to form a source region and a drain region for the pMIS-type field effect transistor.

As a result of such arrangement, a highly-reliable, high-performance nMIS-type field effect transistor is fabricated in the first active region, while in the second active region a pMIS-type field effect transistor, which is superior in mutual conductance, is fabricated because no oxynitride lay is formed.

It is possible that in the second semiconductor device fabrication method:

(a) after the third step and before the fifth step, the semiconductor fabrication method further includes forming a first mask to cover the second active region; and (b) with the first mask applied on the second active region, a large-tilted angle ion implant is performed from above the gate oxide film and gate electrode in the first active region in which ions of nitrogen are implanted from directions including at least a direction with a tilt toward the drain region, to form the oxynitride layer, in the fourth step.

Accordingly, a highly-reliable, high-performance nMIS-type field effect transistor can be fabricated easily.

It is possible that the first semiconductor device fabrication method further includes:

(a) after the third step and before the fifth step, forming a second mask which covers the first active region;

(b) with the second mask applied onto the first active region, performing an ion implant in which ions of nitrogen are implanted into the second active region at approximately right angles to a surface of the semiconductor substrate.

In accordance with the above-described method, a nitrogen diffusion layer is formed within the second active region, which prevents impurity ion channeling in the fifth step. The formation of the source and drain regions becomes stable.

In addition to the above, CMOS-type field effect transistors which suffer less gate electrode depletion and have greater drive power can be formed.

The present invention provides a second semiconductor fabrication method. The second semiconductor device fabrication method comprises the steps of:

(a) a first step of forming a first impurity diffusion layer by introducing an impurity for carrier generation into a semiconductor region of a semiconductor substrate;

(b) a second step of forming a nitrogen diffusion layer by doping into a semiconductor region of the semiconductor substrate to such an extent that deficiency due to collisions with semiconductor atoms does not exceed the level of detection;

(c) a third step of subjecting the semiconductor substrate to an annealing treatment to make the carrier generation impurity active;

wherein:

either one of the first and second steps is performed prior to the other such that the first impurity diffusion layer and the nitrogen diffusion layer at least overlap with each other.

The second semiconductor device fabrication method makes it possible to easily fabricate the second semiconductor devices. Note that the second step and the third step may be carried out in succession.

The first step may be carried out by subjecting the semiconductor substrate to a thermal annealing treatment in an ambient of gas including at least nitrogen.

As a result of such arrangement, no defects, caused by collisions between nitrogen ion and semiconductor atom, occur in the nitrogen diffusion layer, unlike nitrogen ion implantation. This makes it possible to form semiconductor devices free from characteristic degradation due to defects.

The third step may be carried out in an ambient of ammonia gas.

As a result of such arrangement, the functioning of introducing nitrogen into semiconductor substrate is enhanced thereby enabling easy and fast nitrogen diffusion layer formation.

It is preferred that the third step is carried out at a temperature of 900 degrees centigrade or more for ten seconds or less.

The first step may be carried out by generating plasmas in an ambient of gas including at least nitrogen.

As a result of such arrangement, nitrogen diffusion layer formation almost free from defects becomes possible.

The second semiconductor device fabrication method may further include forming a silicide film over the source and drain regions after the third step is carried out.

It is possible that:

(a) a region for formation of a bipolar transistor is provided in the semiconductor substrate;

(b) the semiconductor device fabrication method further comprises:

forming a collector region for the bipolar transistor by introducing an impurity of a first conductivity type into the bipolar transistor formation region;

forming a base region for the bipolar transistor by introducing an impurity of a second conductivity type into the collector region;

(c) in the first step, an impurity of a first conductivity type is introduced into the base region to form an emitter region for the bipolar transistor; and (d) in the second step, nitrogen is doped into an area including at least a portion of the emitter region.

Accordingly, it becomes possible to form bipolar transistors with a high current amplification rate.

It is possible that:

(a) a region for formation of a bipolar transistor is provided in the semiconductor substrate;

(b) the semiconductor device fabrication method further comprises:

forming a collector region for the bipolar transistor by introducing an impurity of a first conductivity type into the bipolar transistor formation region;

forming an emitter region for the bipolar transistor by introducing an impurity of a first conductivity type into the collector region after the first step;

(c) in the first step, a base region for the bipolar transistor is formed by introducing an impurity of a second conductivity type into an area which is in the collector region and which encloses the emitter region;

(d) in the second step, nitrogen is doped into an area including at least a portion of the base region.

This method makes it possible to form bipolar transistors with a high cutoff frequency.

BRIEF DESCRIPTION OF THE DRAWINGS

FIGS. 5(a)–(e) are cross-sectional views illustrating process steps used in the fabrication of a CMOS device in accordance with a fifth embodiment of the present invention.

FIGS. 6(a)–(e) are cross-sectional views illustrating process steps used in the fabrication of a CMOS device in accordance with a sixth embodiment of the present invention.

FIG. 9 is a flow diagram showing the fabrication of a pMOS field effect transistor in accordance with an eighth embodiment of the present invention.

DETAILED DESCRIPTION OF THE INVENTION

First Embodiment

FIGS. 1(a)–(d) are cross-sectional views illustrating process steps used in the fabrication of an nMOS field effect transistor in accordance with a first embodiment of the present invention.

Figure 1A:
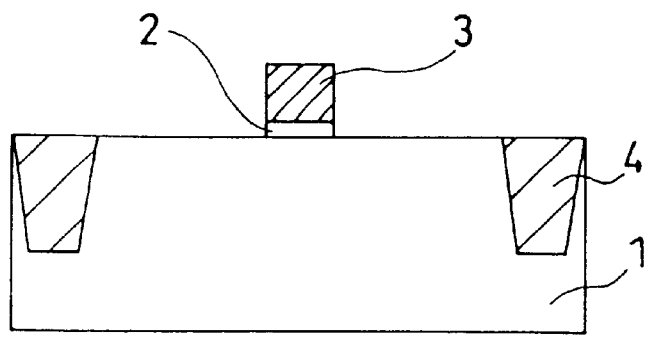
FIGS. 1(a)–(d) are cross-sectional views illustrating process steps used in the fabrication of an nMOS field effect transistor in accordance with a first embodiment of the present invention.

In a process step shown in FIG. 1(a), element isolator 4 is formed in a portion of silicon substrate 1. A film of oxide is then formed by, for example, thermal oxidation on silicon substrate 1 in an active region surrounded by element isolator 4, having a thickness of 7 nm. Next, a polysilicon film is deposited overlying the oxide film, to a thickness of 150 nm. These films are patterned using photolithography and dry etching, to form gate oxide film 2 and gate electrode 3. Not only in the present embodiment but also in the later described embodiments of this invention, the polysilicon film has been doped with n-type impurities by ion implant at the time of or after depositing the same, to secure the conductivity of gate electrode 3.

Figure 1B:
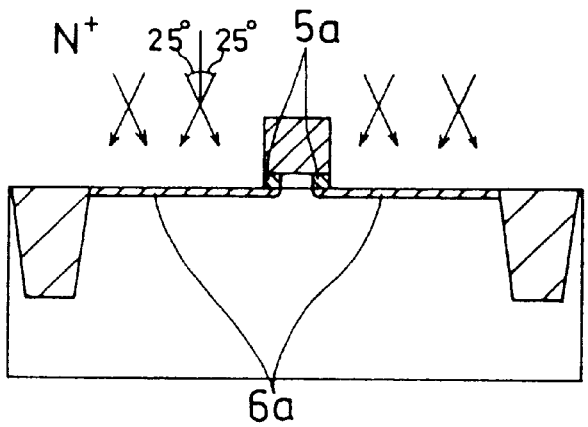

In a process step shown in FIG. 1(b), a four-step ion implant is performed in which ions of nitrogen (N+) are implanted from directions with a tilt angle of 25 degrees to directions perpendicular to the silicon substrate surface in a cross section in parallel with the transistor channel direction, as indicated by arrows in the figure. The implant energy is 10 keV and the dosage is $1\times10^{15} cm^{-2}$. In the four-step ion implant, the implant direction is fixed, and it is arranged such that silicon substrate 1 rotates on the horizontal by an angle of 90 degrees for four-position implantation. Thereafter, the nitrogen ions are diffused by an annealing treatment, whereby oxynitride layer 5a is formed at each edge of gate oxide film 2 and nitrogen diffusion layer 6a is formed in silicon substrate 1. A preferred implant energy range for this nitrogen implant is 5–20 keV. In the process step of FIG. 1(a), the nitrogen ion implant is preferably performed at implant energies ranging from 5 keV to 20 keV at dosages ranging from $1\times10^{13} cm^{-2}$ to $5\times10^{15} cm^{-2}$ at tilted angles ranging from 7 degrees to 45 degrees.

The present embodiment employs a four-step nitrogen ion implant so that the impurity ions are driven into both edges of gate oxide film 2. However, impurity may simply be implanted from one direction with an inclination towards the drain region. Additionally, it is to be noted that the direction in which impurity ions are implanted does not necessarily correspond to the transistor channel direction (i.e., the direction in parallel with the FIG. 1 paper). In other words, the benefits of the present embodiment can be obtained as long as the angle, formed between (a) a line projected onto a surface at which the ion drive direction crosses with the gate width direction at right angles and (b) a line normal to the substrate surface, is 10 degrees or more. What is mentioned above applies in the other embodiments of the present invention.

Figure 1C:
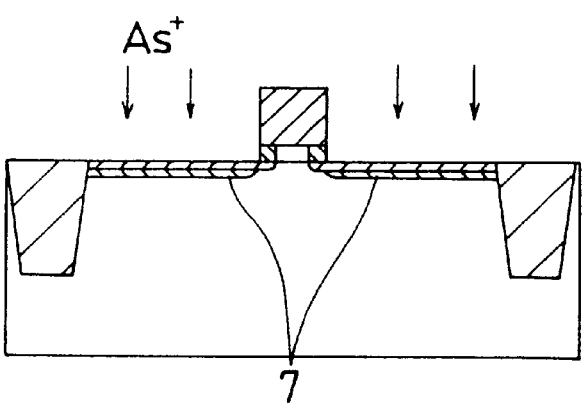

Next, in a process step shown in FIG. 1(c), an arsenic (As+) ion implant is carried out from directions approximately perpendicular to silicon substrate 1 at an implant energy of 10 keV at a dosage of $1 \times 10^{15} cm^{-2}$, to form lightly-doped (low concentration) n-type source/drain region 7 at a near-surface area of silicon substrate 1. The formation of nitrogen diffusion layer 6a in silicon substrate 1 prevents the occurrence of channelling, even when impurity ions are implanted vertically.

Figure 1D:
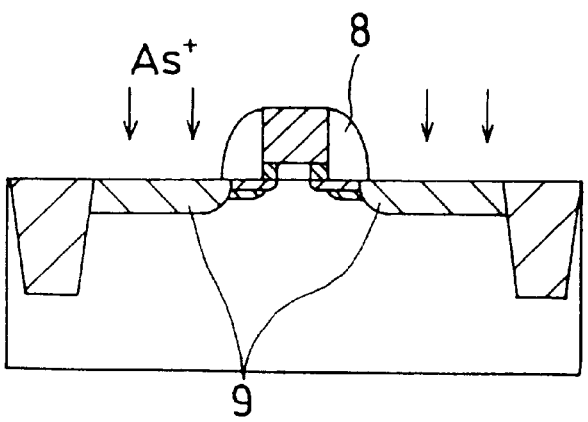

In a process step shown in FIG. 1(d), a relatively thick silicon oxide film is deposited on the substrate. Subsequently, the silicon oxide film is etched back, to form sidewall 8 on each side surface of gate electrode 3. An approximately vertical ion implant is performed in which arsenic ions (As+) are implanted at an implant energy of 30 keV at a dosage of $5 \times 10^{15} cm^{-2}$, to form heavily-doped (high-concentration) n-type source/drain region 9 on one side of each sidewall 8.

An nMOS field effect transistor, fabricated in accordance with the fabrication process steps of the present embodiment, differs in structure from a conventional transistor having an oxynitride layer. More specifically, in the present nMOS field effect transistor, oxynitride layer 5a is formed only at both edges of gate oxide film 2. A major cause of hot carrier degradation exists in the fact that hot carriers are captured in a gate oxide film on the drain side. Accordingly, the formation of oxynitride layer 5a at at least one of the edges of gate oxide film 2 (oxynitride is formed at each edge of gate oxide film 2 in the present embodiment), prevents the occurrence of hot carrier degradation.

In the present embodiment, it is sufficient to implant nitrogen ions, only into an edge of gate oxide film 2 by a large-tilted-angle implant, thereby making it possible to form oxynitride layer 5a by a nitrogen ion implant in which ions of nitrogen are implanted at a low implant energy of 10 keV at a low dosage of approximately $1 \times 10^{15} cm^{-2}$. In the case of the aforementioned conventional method in which an oxynitride layer is formed covering the entire area of a gate oxide film, the dosage of nitrogen must be increased and, as a result, gate electrode depletion occurs. Conversely, in accordance with the present embodiment, the nitrogen dosage can be held very low, thereby preventing the occurrence of gate electrode depletion.

Additionally, nitrogen diffusion layer 6a is formed in silicon substrate 1 in the process step of FIG. 1(b), not to a great depth, so that crystallinity disturbance occurs only in limited areas. Further, since the concentration of nitrogen in nitrogen diffusion layer 6a is also low, this can retain the degree of disturbance in crystallinity in the silicon substrate 1 to a minimum. Accordingly, degradation in transistor performance can be held low and transistor reliability can be improved.

In the present embodiment, oxynitride layer 5a is formed at each edge of gate oxide film 2. However, it is sufficient to form oxynitride, only at one edge of gate oxide film 2 on the drain side, which applies also in each of the following embodiments of the present invention.

Second Embodiment

FIGS. 2(a)–(d) are cross-sectional views illustrating process steps used in fabricating an nMOS field effect transistor in accordance with a second embodiment of the present invention.

Figure 2A:
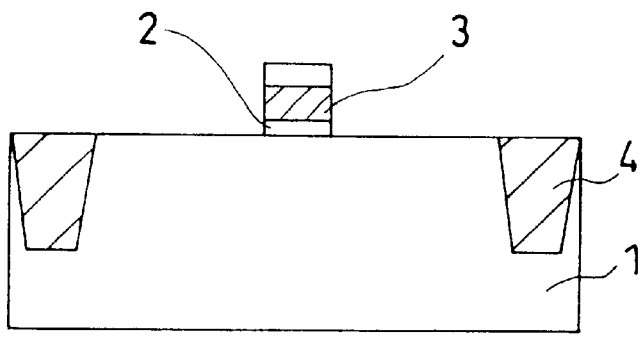
FIGS. 2(a)–(d) are cross-sectional views illustrating process steps used in the fabrication of an nMOS field effect transistor in accordance with a second embodiment of the present invention.

In a process step shown in FIG. 2(a), element isolator 4 is formed in a portion of silicon substrate 1. A film of oxide is then formed by, for example, thermal oxidation at silicon substrate 1 within an active region surrounded by element isolator 4, this oxide film having a thickness of 7 nm. This is followed by deposition of a 150-nm thick polysilicon film and a 150-nm thick oxide film on the aforesaid 7-nm thick oxide film. These three films are patterned using photolithography and dry etching, to form gate oxide film 2, gate electrode 3 and over-gate oxide film 10.

Figure 2B:
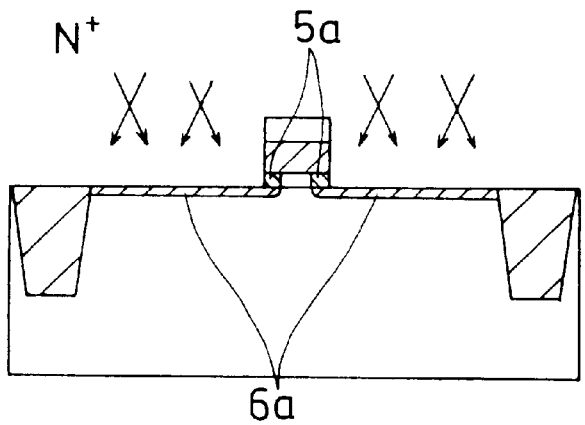

In a process step shown in FIG. 2(b), a four-step ion implant is carried out in which ions of nitrogen (N+) are implanted from directions with a tilt angle of 25 degrees to directions perpendicular or normal to the substrate surface, as indicated by arrows in the figure. The implant energy is 10 keV and the dosage is $1 \times 10^{15} cm^{-2}$. In this four-step ion implant method, the implant direction is fixed, and it is arranged such that silicon substrate 1 rotates on the horizontal by 90 degrees for four-position implantation. Thereafter, the nitrogen ions are diffused by a thermal annealing treatment to form oxynitride layer 5a at each edge of gate oxide film 2 as well as to form nitrogen diffused layer 6a in silicon substrate 1. In the process step of FIG. 2(b), the preferable implant energy ranges from 5 keV to 30 keV, the preferable dosage ranges from $1 \times 10^{13} cm^{-2}$ to $5 \times 10^{16} cm^{-2}$ and the preferable angle of tilt ranges from 7 degrees to 45 degrees.

Figure 2C:
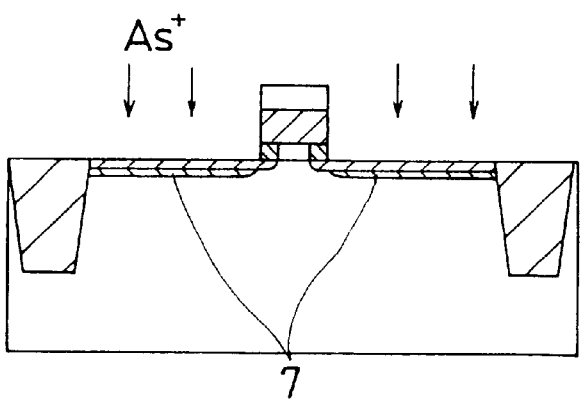

In a process step shown in FIG. 2(c), an ion implant is carried out in which ions of arsenic (As+) are implanted from the direction approximately perpendicular to the surface of silicon substrate 1 at an implant energy of 10 keV at a dosage of $1 \times 10^{14} cm^{-2}$, to form lightly-doped (low-concentration) n-type source/drain region 7 in a near-surface area of silicon substrate 1.

Figure 2D:
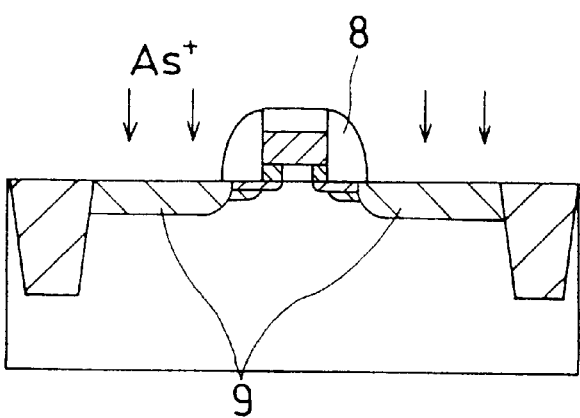

In a process step shown in FIG. 2(d), a rather thick silicon oxide film is deposited overlying the substrate surface. The silicon oxide film deposited is then etched back, to form sidewall 8 on each side surface of gate electrode 3. This is followed by an ion implant in which ions of arsenic (As+) are implanted at approximately right angles to the substrate surface at an implant energy of 30 keV with a dosage of $5 \times 10^{15} cm^{-2}$, whereby heavily-doped (high-concentration) n-type source/drain region 9 is formed on one side of each sidewall 8.

In addition to the effects of the first embodiment, the present embodiment provides the following effect. In accordance with the present embodiment, over-gate oxide film 10 is formed on gate electrode 3, so that the quantity of nitrogen which is implanted into gate electrode 3 in the process step of FIG. 2(b) can be considerably reduced. This enables the control of transistor characteristic degradation due to depletion of gate electrode 3. Additionally, even if the implant energy and dosage of nitrogen is increased, this will not cause gate electrode 3 to deplete and it becomes possible to widen the range of selection for requirements.

Third Embodiment

FIGS. 3(a)–(d) are cross-sectional views of process steps used in the fabrication of a CMOS device in accordance with a third embodiment of the present invention.

Figure 3A:
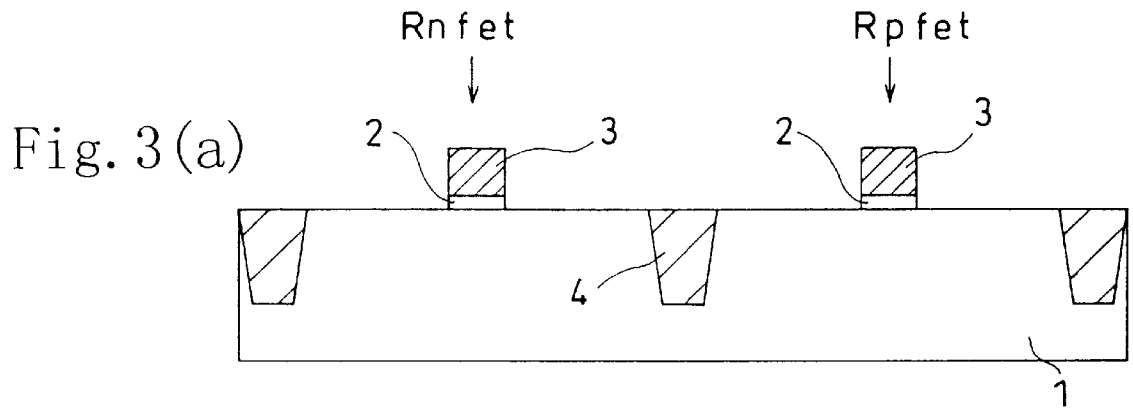
FIGS. 3(a)–(d) are cross-sectional views illustrating process steps used in the fabrication of a CMOS device in accordance with a third embodiment of the present invention.

In a process step shown in FIG. 3(a), element isolator 4 is formed in silicon substrate 1 for isolation between an nMOSFET formation region Rnfet (a first active region) and a pMOSFET formation region Rpfet (a second active region). A film of oxide is then formed by, for example, thermal oxidation on silicon substrate 1 within each region Rnfet and Rpfet surrounded by element isolator 4, this oxide film having a thickness of 7 nm. Subsequently, a film of polysilicon is deposited on the oxide film to a thickness of 150 nm. Both the oxide film and the polysilicon film are patterned by photolithography and dry etching, to form gate oxide film 2 and gate electrode 3 in each region Rnfet and Rpfet. To secure the conductivity of gate electrode 3, the polysilicon film on region Rnfet is n-doped and the polysilicon film on region Rpfet is p-doped at or after the deposition by CVD (chemical vapor deposition), not only in the present embodiment but also in the following embodiments (the fourth to sixth embodiments of the present invention).

Figure 3B:
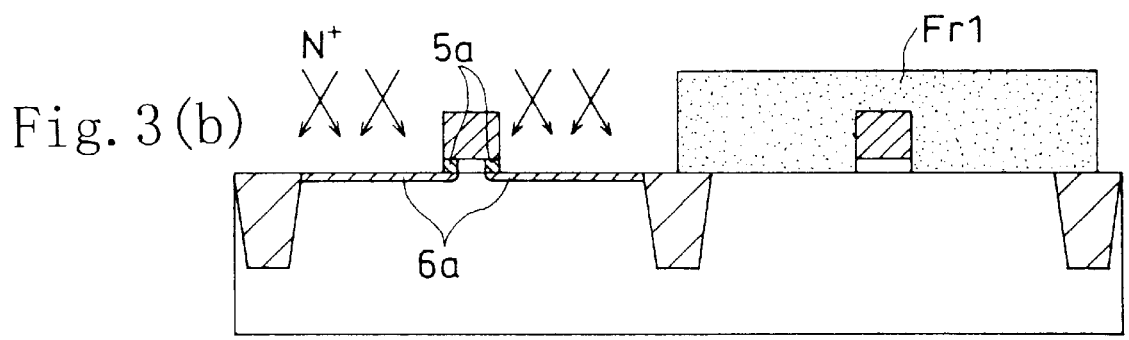

Next, in a process step shown in FIG. 3(b), a film of photoresist Fr1 is applied covering region Rpfet (the pMOSFET formation region). Through photoresist film Fr1 serving as a mask, a four-step ion implant is performed in which ions of nitrogen (N+) are implanted at an implant energy of 10 keV at a dosage of $1 \times 10^{15} cm^{-2}$, at an angle of tilt of 25 degrees to the direction perpendicular to the surface of silicon substrate 1. This is followed of diffusion of the nitrogen ions by a thermal annealing treatment, to form oxynitride film 5a at each edge of gate oxide film 2 of region Rnfet (the nMOSFET formation region) as well as to form nitrogen diffusion layer 6a in silicon substrate 1. Here, neither oxynitride layer 5a nor nitride diffusion layer 6a is formed in region Rpfet, and the fabrication proceeds to the subsequent process step.

Figure 3C:
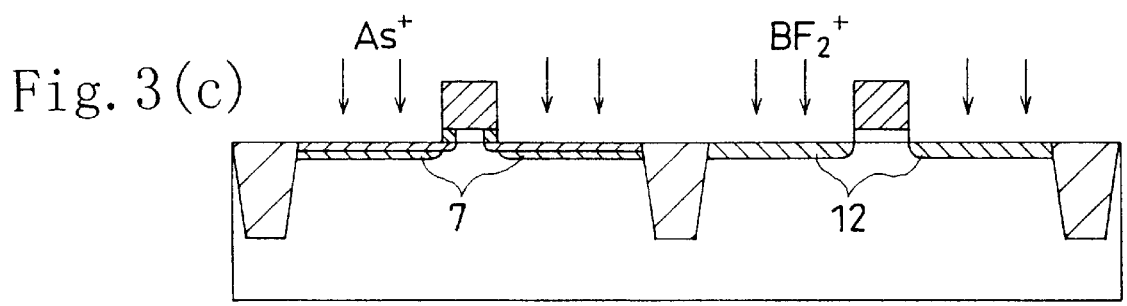

In a process step shown in FIG. 3(c), separate photoresist films are applied over regions Rnfet and Rpfet (not shown in the figure). Lightly-doped source/drain region 7 is formed in region Rnfet while lightly-doped source/drain region 12 is formed in region Rpfet. More specifically, an ion implant is carried out on region Rnfet in which ions of arsenic (As+) are implanted at an implant energy of 10 keV at a dosage of $1 \times 10^{14} cm^{-2}$ at approximately right angles to the substrate surface, to form lightly-doped n-type source/drain region 7, and an ion implant is carried out on region Rpfet in which ions of boron fluoride ($BF_2$+) are implanted at an implant energy of 10 keV at a dosage of $1 \times 10^{14} cm^{-2}$ at approximately right angles to the substrate surface, to form lightly-doped p-type source/drain region 12.

Figure 3D:
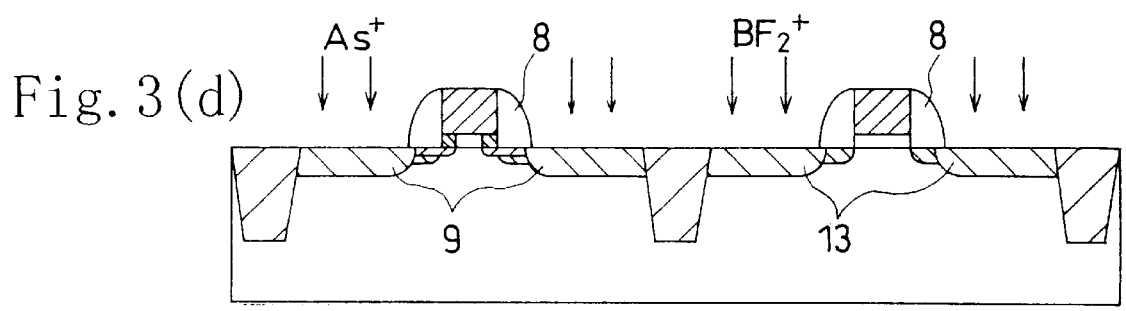

Next, in a process step shown in FIG. 3(d), after deposition of a rather thick silicon oxide on the substrate, an etch back process is carried out to form on each side of gate electrode 3 sidewall 8. Thereafter, separate films of photoresist are formed on regions Rnfet and Rpfet (not shown in the figure), and heavily-doped source/drain regions 9 and 13 are created in region Rnfet and in region Rpfet, respectively. More specifically, an ion implant is performed into region Rnfet in which ions of arsenic (As+) are implanted at an implant energy of 30 keV at a dosage of $5 \times 10^{15} cm^{-2}$ at approximately right angles to the substrate surface, to form heavily-doped n-type source/drain region 9 on one side of each sidewall 8 as shown in the figure. On the other hand, an ion implant is performed into region Rpfet in which ions of boron fluoride (BF2+) are implanted at an implant energy of 30 keV at a dosage of $5 \times 10^{15} cm^{-2}$ at approximately right angles to the substrate surface, to form heavily-doped n-type source/drain region 13 on one side of each sidewall 8 as shown in the figure.

In the present embodiment, eventually, nitrogen is implanted only into the nMOS field effect transistor to form oxynitride layer 5a and nitrogen diffuses layer 6a. Accordingly, the present embodiment provides, in addition to the effects of the third embodiment, an effect of controlling the degradation of mutual conductance in the pMOS field effect transistor.

Fourth Embodiment

FIGS. 4(a)–(d) are cross-sectional views depicting process steps used in the fabrication of a CMOS device in accordance with a fourth embodiment of the present invention.

Figure 4A:
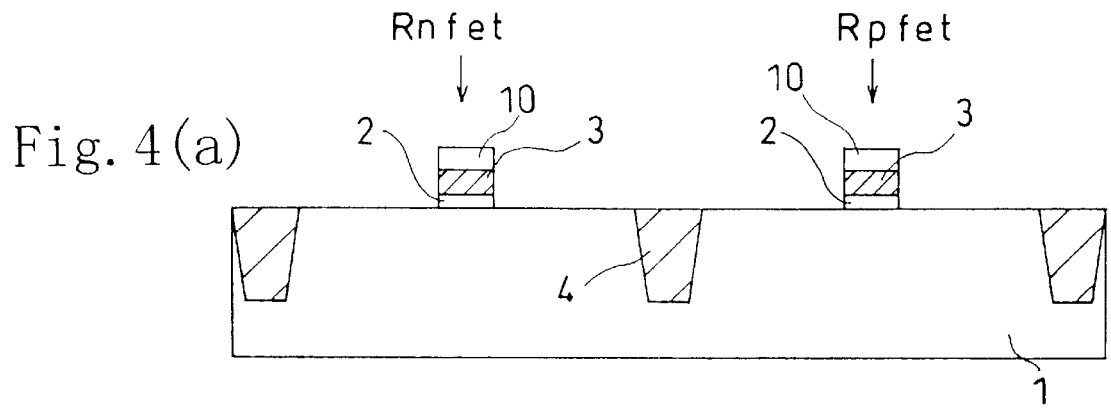
FIGS. 4(a)–(d) are cross-sectional views illustrating process steps used in the fabrication of a CMOS device in accordance with a fourth embodiment of the present invention.
Figure 4B:
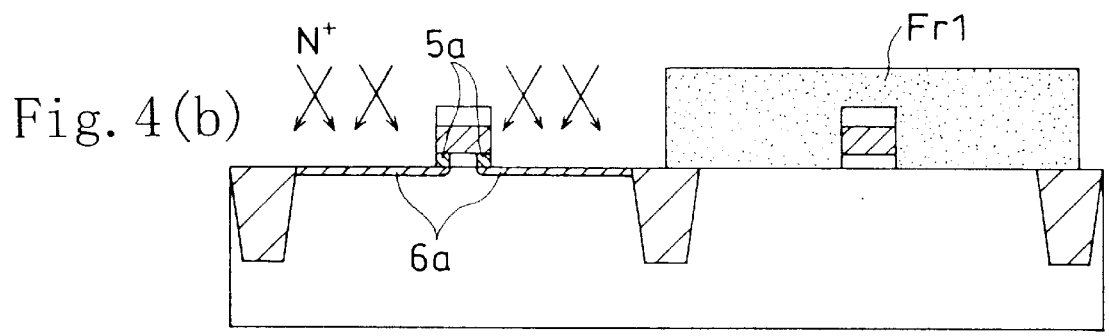
Figure 4C:
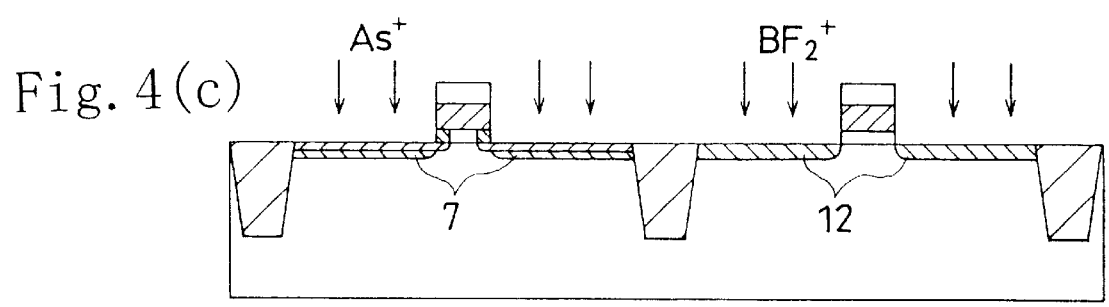
Figure 4D:
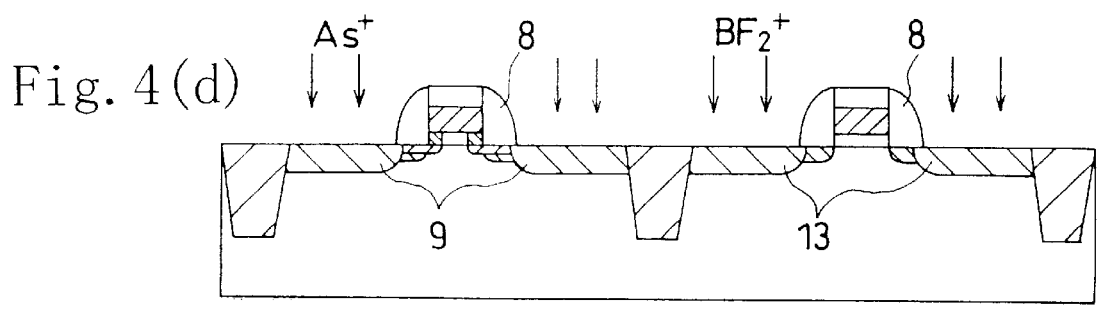

In the present embodiment the same process steps as shown in FIGS. 3(a)–(d) are carried out, with the exception that over-gate oxide film 10 is formed on gate electrode 3 at the FIG. 4(a) process step.

Such arrangement allows the present embodiment to provide, in addition to the aforementioned effects of the third embodiment, anther effect of achieving considerable reduction of the quantity of nitrogen being implanted into gate electrode 3 because of the provision of over-gate oxide film 10 on gate electrode 3, therefore ensuring that transistor performance degradation due to the depleting of gate electrode 3 is prevented.

Fifth Embodiment

FIGS. 5(a)–(e) are cross-sectional views depicting process steps used in the fabrication of a CMOS device in accordance with a fifth embodiment of the present invention.

In a process step shown in FIG. 5(a), element isolator 4 is formed in a porion of silicon substrate 1. A film of oxide is formed by, for example, thermal oxidation, on silicon substrate 1 within an active region surrounded by element isolator 4, the oxide film having a thickness of 7 nm. A film of polysilicon is deposited on the oxide film to a thickness of 150 nm. Subsequently, the oxide film and the polysilicon film are patterned using photolithography and dry etching, to form gate oxide film 2 and gate electrode 3 in region Rnfet (the nMOSFET formation region) as well as in region Rpfe (the pMOSFET formation region).

In a process step shown in FIG. 5(b), a film of photoresist Fr1 is applied covering region Rpfet. Through photoresist film Fr1 serving as a mask, a four-step ion implant is carried out in which ions of nitrogen (N+) are implanted at an implant energy of 10 keV at a dosage of $1 \times 10^{15} cm^{-2}$, at an angle of tilt of 25 degrees to the direction perpendicular to the surface of silicon substrate 1. The nitrogen ions thus implanted are diffused by a thermal annealing treatment, to form oxynitride film 5a at each edge of gate oxide film 2 of region Rnfet as well as to form nitrogen diffusion layer 6a in silicon substrate 1.

In a process step shown FIG. 5(c), a film of photoresist Fr2 is applied covering region Rnfet. Through photoresist film Fr2 serving as a mask, an ion implant is carried out in which ions of nitrogen (N+) are implanted at an implant energy of 10 keV at a dosage of $1 \times 10^{15} cm^{-2}$, at approximately right angles to the substrate surface. Subsequently, the nitrogen ions implanted are diffused by a thermal annealing treatment, to form nitrogen diffuses layer 6 in silicon substrate 1 of region Rpfet. Weak oxynitride layer 5 is formed in gate oxide film 2.

In a process step shown in FIG. 5(d), separate films of photoresist are formed on regions Rnfet and Rpfet (not shown in the figure), and lightly-doped source/drain regions 7 and 12 are formed in the region Rnfet and in the region Rpfet, respectively. More specifically, an ion implant is performed into region Rnfet in which ions of arsenic (As+) are implanted at an implant energy of 10 keV at a dosage of $1\times10^{14} cm^{-2}$ at approximately right angles to the substrate surface, to form lightly-doped n-type source/drain region 7. On the other hand, an ion implant is performed into region Rpfet in which ions of boron fluoride ($BF_2$+) are implanted at an implant energy of 10 keV at a dosage of $1\times10^{14} cm^{-2}$ at approximately right angles to the substrate surface, to form lightly-doped p-type source/drain regions 12.

Next, in a process step shown in FIG. 5(e), after deposition of a rather thick silicon oxide on the substrate, an etch back process is carried out to form on each side surface of gate electrode 3 sidewall 8. Thereafter, separate films of photoresist are applied covering regions Rnfet and Rpfet (not shown in the figure), and heavily-doped source/drain regions 9 and 13 are formed in region Rnfet and in region Rpfet, respectively. More specifically, an ion implant is performed into region Rnfet in which ions of arsenic (As+) are implanted at an implant energy of 30 keV at a dosage of $5\times10^{15} cm^{-2}$ at approximately right angles to the substrate surface, to form heavily-doped n-type source/drain regions 9 on one side of each sidewall 8 as shown in the figure. On the other hand, an ion implant is performed into region Rpfet in which ions of boron fluoride ($BF_2$+) are implanted at an implant energy of 30 keV at a dosage of $5\times10^{15} cm^{-2}$ at approximately right angles to the substrate surface, to form heavily-doped p-type source/drain regions 13 on one side of each sidewall 8 as shown in the figure.

CMOS devices, fabricated in accordance with the present embodiment, are approximately identical in structure with ones formed in accordance with the third embodiment. However, in a CMOS device of the present embodiment, nitrogen diffusion layer 6 is formed within silicon substrate 1 of the pMOS field effect transistor. Such formation provides, in addition to the effects of the third embodiment, another effect of preventing channelling from occurring in region Rpfet at the time of implanting impurity ions, and the stable formation of source/drain regions can be achieved. Nitrogen is implanted at approximately right angles to the substrate surface, as a result of which an oxynitride layer is slightly formed in gate electrode 3 of gate oxide film 2, whereby boron penetration from gate electrode 3 towards silicon substrate 1 can be held as low as possible in the pMOS field effect transistor.

Sixth Embodiment

FIGS. 6(a)–(e) are cross-sectional views illustrating process steps used in the fabrication of a CMOS device in accordance with a sixth embodiment of the present invention.

The CMOS device fabrication of the present embodiment is almost the same as the CMOS device fabrication of the fifth embodiment. However, in the present embodiment, over-gate oxide film 10 is formed on gate electrode 3 in the FIG. 6(a) process step.

Because of the provision of over-gate oxide film 10 overlying gate electrode 3, the CMOS device of the present embodiment provides an effect of considerably reducing the quantity of nitrogen that is implanted into gate electrode 3, in addition to the effects of the fifth embodiment, thereby further ensuring that degradation in transistor characteristic due to the depleting of gate electrode 3 is prevented.

Seventh Embodiment

Figure 7A:
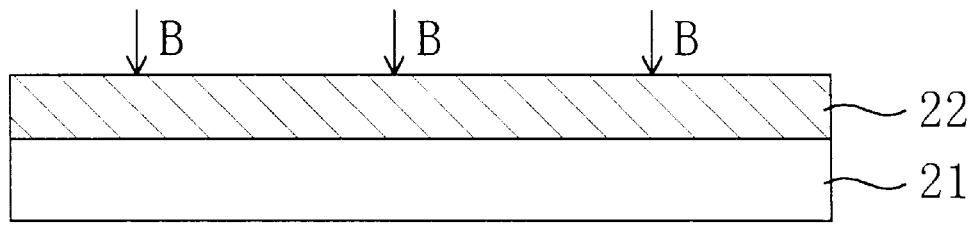
FIGS. 7(a)–(c) are cross-sectional views illustrating process steps of the formation of an impurity diffusion layer in a seventh embodiment of the present invention.
Figure 7B:
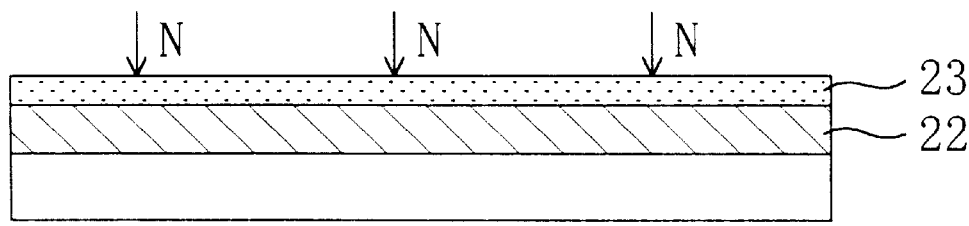
Figure 7C:
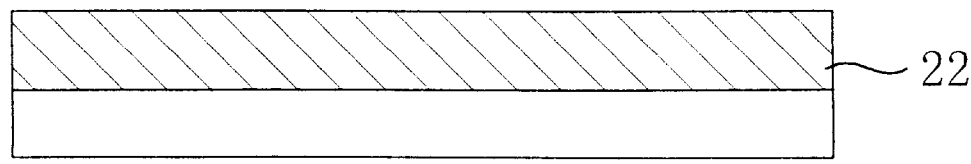

FIG. 7, comprised of 7(a)–(c), shows the fabrication of a semiconductor device of a seventh embodiment of the present invention. With reference to FIGS. 7(a)–(c), process steps for improving the distribution of impurity concentration in p-type diffusion layer will be described below.

In a process step shown in FIG. 7(a), an ion implant is carried out to n-type silicon substrate 21 in which ions of boron (B+) are implanted at an implant energy of 10 keV at a dosage of $2\times10^{15} cm^{-2}$. Alternatively, an ion implant may be performed in which ions of $BF_2$ are implanted at an implant energy of 30 keV at a dosage of $2\times10^{15} cm^{-2}$. Such boron or $BF_2$ doping forms p-type diffusion layer 22 which will be later subjected to an activation treatment.

Next, in a process step shown in FIG. 7(b), silicon substrate 21 is placed in a commonly-used rapid thermal annealing apparatus, and a rapid thermal annealing treatment is carried out at 900 degrees centigrade for ten seconds in an ambient of ammonia gas at a flow rate of 5 lit. per minute. As a result, nitrogen is introduced into silicon substrate 21, and boron/nitrogen mixture layer 23 (nitrogen diffusion layer) is formed in areas from the surface of silicon substrate 21 down to a predetermined depth.

In a process step shown in FIG. 7(c), a thermal annealing treatment is performed by rapid thermal annealing apparatus at 1000 degrees centigrade for ten seconds, and, as a result, the boron or $BF_2$ in p-type diffusion layer 22 is activated and diffused. The range of p-type diffusion layer 22 is defined. The nitrogen becomes diffused together with the boron (or $BF_2$).

Figure 8:
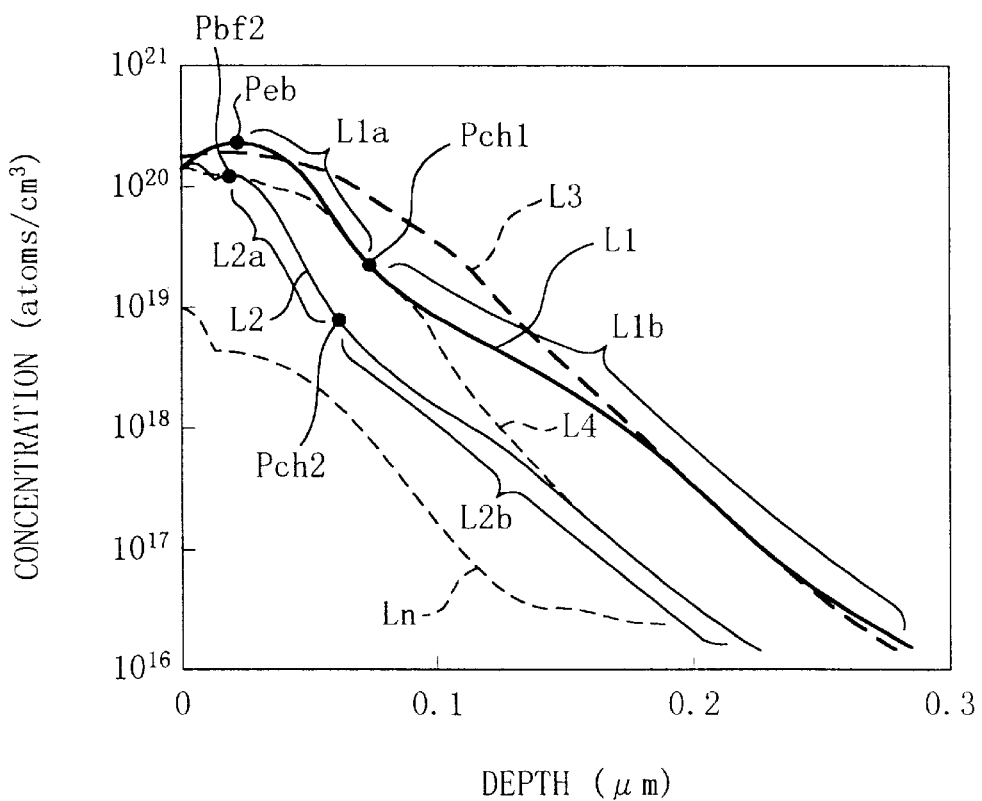
FIG. 8 shows impurity concentration profiles of (a) a boron diffusion layer with nitrogen introduction, (b) a $BF_2$ diffusion layer with nitrogen introduction, (c) a boron diffusion layer without nitrogen introduction and (d) a $BF_2$ diffusion layer with nitrogen introduction.

FIG. 8 shows concentration profiles in the direction of depth, for boron and $BF_2$ (concentration distribution curves L1 and L2), and nitrogen (a concentration distribution curve Ln) in p-type diffusion layer 22 of the present embodiment. For the purpose of comparison with L1 and L2, concentration distribution curves L3 and L4 for boron and $BF_2$ with thermal annealing for activation but without rapid thermal annealing in an ambient of ammonia gas, are shown. In the following description, SAMPLE-a, SAMPLE-b, SAMPLE-c and SAMPLE-d are used as examples. SAMPLE-a is a p-type diffusion layer of the present embodiment, in other words SAMPLE-a is a source/drain region which has undergone a rapid thermal annealing treatment in an ambient of ammonia gas after a boron implant. SAMPLE-b is a p-type diffusion layer which has undergone a rapid thermal annealing treatment in an ambient of ammonia gas after a $BF_2$ implant at an implant energy of 30 keV. SAMPLE-c is a p-type diffusion layer which has undergone no rapid thermal annealing treatment in an ambient of ammonia gas after a boron implant at an implant energy of 10 keV. Finally, SAMPLE-d is a p-type diffusion layer which has undergone no rapid thermal annealing treatment in an ambient of ammonia gas after a $BF_2$ implant at an implant energy of 30 keV. The reason of why boron and $BF_2$ are implanted at different levels of implant energy is to give compensation for the difference in implant depth caused by the difference in mass.

As can be seen from the concentration profile curve L1 of FIG. 8, SAMPLE-a, which has undergone a rapid thermal annealing treatment in an ammonia gas ambient after implantation of boron and doping of nitrogen, has the feature that, since an area of the original impurity diffusion layer 22 down to a depth of approximately 0.1 $\mu$m becomes boron/nitrogen mixture layer 23, the concentration of boron in boron/nitrogen mixture layer 23 is high. When compared with SAMPLE-c (L3), which has undergone no nitrogen doping, the boron concentration of SAMPLE-a rapidly decreases after passing through a peak point Peb (a region L1a in the figure). However, the decreasing rate drops in the vicinity of a point Pch1 and thereafter the boron concentration of SAMPLE-a decreases at a relatively gentle rate, so that the boron concentration of SAMPLE-a approaches to that of SAMPLE-c (a region L1b in the figure). In other words, the point Pch is an inflection point of concentration when the concentration is a function of the depth. The reason of why the concentration distribution of the boron in SAMPLE-a exhibits the above-described form may be explained as follows. During the annealing treatment for activation, boron diffusion is held low by boron present in boron/nitrogen mixture layer 23, and the boron, after the activation, tends to intensively exist or concentrate in an area, the nitrogen concentration of which is high, located above an approximately 0.1-μm depth.

Conventionally, the doping of nitrogen into semiconductor substrates has been proposed in the art. In such a case, ions of nitrogen are doped. However, it has been deemed problematic and impossible to successfully perform a practical nitrogen doping into a semiconductor substrate with an annealing treatment in a nitrogen ambient such as in an ammonia gas ambient. The present embodiment makes it possible to form a relatively heavily-doped nitrogen diffusion layer in a silicon substrate by carrying out a rapid thermal annealing treatment at a relatively high temperature in an ammonia gas ambient.

Unlike an ion implant in which ions of nitrogen are doped into a silicon substrate, the present embodiment employs nitrogen doping by thermal annealing so that no defects occur to silicon substrates. It is understood that impurity diffusion is not controlled by defects created at the time of doping of nitrogen. L4, which is the concentration distribution curve of SAMPLE-d which has undergone an activation process with $BF_2$ introduction but without nitrogen doping, has a peak in the value in immediate proximity to the surface. After the value peak, L4 gently decreases and the peak value is small. The reason for this may be that the diffusion of $BF_2$ is overall controlled by the presence of fluorine. The impurity concentration profile of the present embodiment cannot be obtained by $BF_2$ implantation only.

On the other hand, L2, which is the concentration distribution curve of SAMPLE-b which has undergone a rapid thermal annealing treatment in an ambient of ammonia gas after introduction of $BF_2$ and N, has an inflection point Pch2 at a depth of approximately 0.07 μm (<0.1 μm). This allows heavily-doped areas to concentrate in a much smaller range.

FIG. 8 shows various concentration profiles obtained by performing, under particular conditions, nitrogen implantation and rapid thermal annealing treatment in an ambient of ammonia gas. However, the temperature and time of rapid thermal annealing treatment may be adjusted, or the step of implanting boron and the step of performing rapid thermal annealing treatment may be carried out in a different order, to control the profile of boron concentration.

Additionally, it is preferred that the rapid thermal annealing treatment be performed at a temperature of 900 degrees centigrade or more for 10 seconds or more, for generally ammonia gas pyrolytically decomposes at above 800 degrees centigrade and becomes activated at above 900 degrees centigrade. Generally, the ammonia flow rate is from about 1 to about 10 slm, which, however, is not to be considered restrictive. It has been confirmed that the concentration distribution in the vicinity of the surface shown by LI of FIG. 8 becomes further steeper by performing a pulse-like thermal annealing treatment for a considerably short period of time (for example, cooling starts as soon as a target temperature is reached). In other words, the peak value Peb further increases and the inflection point Pch1 shifts to the left.

Further, the step of performing a rapid thermal annealing treatment in an ambient of ammonia gas and the step of performing a thermal annealing treatment for impurity activation may be carried out by a single annealing treatment. Alternatively, these two thermal annealing treatments may be carried out continuously as multi-stage processing.

Even if implant conditions of boron or $BF_2$ into a semiconductor substrate somewhat vary, the same effects that the present embodiment provides can be obtained by adequately selecting conditions for rapid thermal annealing in an ambient of ammonia gas.

As impurities for carrier generation which are introduced into semiconductor substrates, phosphorus, arsenic, indium and antimony may be used in addition to boron. The doping of nitrogen produces the effect that not only the diffusion of carrier generation impurities but also the diffusion of impurities (i.e., fluorine) which do not generate carriers can be controlled. In other words, there is produced an effect of creating an inflection point in a concentration profile curve thereof.

It can be expected that rapid thermal annealing, which is performed in an ambient of gas resulting from adding to ammonia gas an inert gas such as nitrogen gas and argon gas, provides the same effects that the present embodiment does. Further, a rapid thermal anneal, which is carried out in an ambient of mixed gas of nitrogen and, for example, hydrogen or in an ambient of $NF_3$ gas, provides the same effects as in the present embodiment.

The semiconductor region of the present invention may be a polycrystalline semiconductor region or an amorphous semiconductor region such a polysilicon region, in addition to the monocrystalline semiconductor region. In order to increase conductivity, impurities for carrier generation such as boron, phosphorous and arsenic may be introduced into polycrystalline or amorphous regions. In such a case, the same impurity concentration profile as obtained in the present embodiment can be created by doping nitrogen into the regions.

Eighth Embodiment

An eighth embodiment of the present invention is now described which is an example of the impurity concentration distribution improving technology disclosed in the seventh embodiment for improving the characteristic of pMOS devices. FIG. 9 is a flow diagram showing the flow of the fabrication of a pMOS device of the present embodiment. FIGS. 10(a)–(d) are cross-sectional views illustrating process steps used in the fabrication of a pMOS device according to the present embodiment.

Figure 10A:
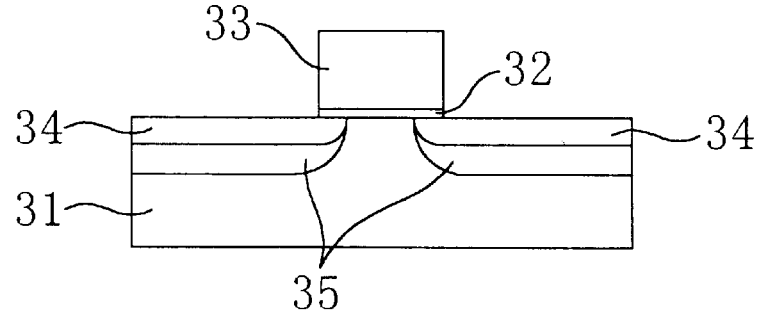
FIGS. 10(a)–(d) are cross-sectional views illustrating process steps used in the fabrication of a pMOS field effect transistor of the eighth embodiment of the present invention.

In a process step shown in FIG. 10(a), n-type well 31 is formed in a silicon substrate. A film of oxide is then formed overlying n-type well 31, having a thickness of approximately 4 nm. A film of polysilicon is formed on gate oxide film 32, having a thickness of approximately 200 nm. The oxide and polysilicon films are patterned using lithography and RIE (reactive ion etching), to form gate oxide film 32 and gate electrode 33. Thereafter, through gate electrode 33 acting as a mask, an ion implant is carried out in which ions of $BF_2$ are implanted at an implant energy of about 10 keV at a dosage of about $1\times10^{14} cm^{-2}$, to form source/drain extension 34 (p-type diffusion layer). Further, still using gate electrode 33 as a mask, an ion implant is performed in which ions of arsenic are implanted at an implant energy of about 160 keV at a dosage of about $6\times10^{12} cm^{-2}$ at an angle of tilt of about 20 degrees, to form pocket 35 (n-type diffusion layer) for the purpose of providing an improved punch-through breakdown voltage.

Figure 10B:
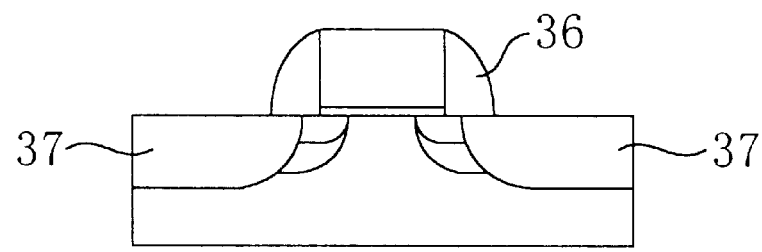

In a process step shown in FIG. 10(b), a film of oxide is deposited by LPCVD using TEOS gas, to a thickness of 120 nm. Subsequently, this oxide film is etched back by dry etching such that portions of the oxide film remain on both sides of gate electrode 33, whereby sidewall 36 is formed on each side surface of the gate electrode 33. This is followed by an ion implant in which ions of boron are implanted at an implant energy of about 10 keV at a dosage of about $2 \times 10^{15} cm^{-2}$, to form source/drain region 37 (p-type diffusion layer). At this time, boron is introduced also into the gate, as a result of which an electrode for a p-type transistor is formed.

Figure 10C:
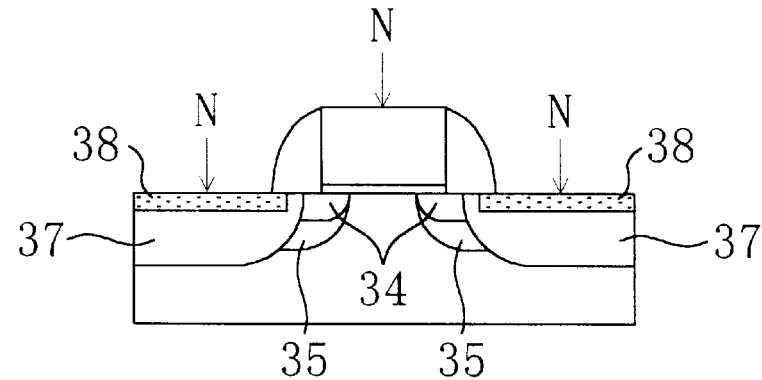

In a process step shown in FIG. 10(c), the silicon substrate is placed in a commonly-used rapid thermal annealing apparatus, and an annealing treatment is carried out at 900 degrees centigrade for ten seconds in an ammonia gas ambient produced by ammonia gas at a flow rate of 5 lit. per minute. As a result, nitrogen is doped into the silicon substrate, and boron/nitrogen mixture layer 38 (nitrogen diffusion layer) is formed at a near-surface area of source/drain region 37. Further, an annealing treatment, as an annealing treatment for impurity activation, is carried out at a temperature of about 1000 degrees centigrade for about ten seconds in the rapid thermal annealing apparatus, to define the range of p-type extension 34, p-type source/drain region 37 and n-type pocket 35. At this time, as in the p-type diffusion layer 22 of the first embodiment, nitrogen is diffused in source/drain region 37 to a depth of about 0.1 $\mu$m at a high concentration. Therefore, the boron concentration profile of source/drain region 37 approximately corresponds to the profile of FIG. 8, in other words source/drain region 37 has such a concentration profile that high boron concentration areas concentrate in the vicinity of the surface. The diffusion of impurities is held low by nitrogen, also in extension 34, so that relatively high-concentration boron exists in a near-surface area of extension 34, and an area, located immediately underneath the aforesaid high-concentration area, has a concentration profile showing a steep concentration gradient (concentration drop).

Although in the present embodiment impurities for the formation of extension 34 and pocket region 35 are introduced also into source/drain region 37, the presence of the introduced impurities in source/drain region 37 can be safely ignored, for the dosage used in the formation of extension 34 and pocket 35 is very small as compared with the dosage used in the formation of source/drain region 37. However, the presence may affect the geometric form of source/drain region 37, which is described later.

Figure 10D:
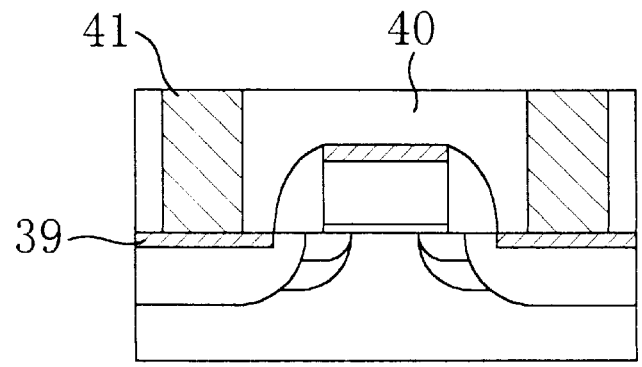

In a process step shown in FIG. 10(d), a metal with a high melting point such as titanium (Ti) is deposited by sputtering, to a thickness of 30 nm and is then subjected to an annealing treatment at a temperature of 700 degrees centigrade for one minute. As a result of such an annealing treatment, a near-surface area of source/drain region 37 formed of silicon, a near-surface area of gate electrode 33 formed of polysilicon, and other near-surface areas are brought to react with Ti, to form layers 39 of titanium silicide in these near-surface areas. Thereafter, Ti films, which are not silicided and remain not reacted, are stripped by wet etching. This is followed by the formation of interlayer dielectric 40, buried plug 41 to a contact hole, interconnect lines (not shown in the figure) on the substrate, to fabricate a surface channel type pMOSFET.

As a result of employing such a fabrication method, the high-concentration area of source/drain region 37 and the relatively high-concentration area of extension 34 concentrate in the vicinity of the surface, thereby providing an improved punch-through breakdown voltage as well as an improved short channel effect controlling function, as will be described later in detail.

Measurement in transistor characteristic was made and the result is described below. In the description, (a) SAMPLE-A is a p-type MOSFET of the present embodiment, in other words SAMPLE-A has a source/drain region which has undergone a rapid thermal annealing treatment in an ambient of ammonia gas after an implant of boron, (b) SAMPLE-B is a p-type MOSFET which has undergone a rapid thermal annealing treatment in an ambient of ammonia gas after an implant of $BF_2$ at an implant energy of 30 keV, (c) SAMPLE-C is a p-type MOSFET which has undergone no rapid thermal annealing treatment in an ambient of ammonia gas after an implant of boron at an implant energy of 10 keV and (d) SAMPLE-D is a p-type MOSFET which has undergone no rapid thermal annealing treatment after an implant of $BF_2$ at an implant energy of 30 keV. The reason of why boron and $BF_2$ are implanted at different levels of implant energy is to give compensation for the difference in implant depth caused by the difference in mass.

Figure 11:
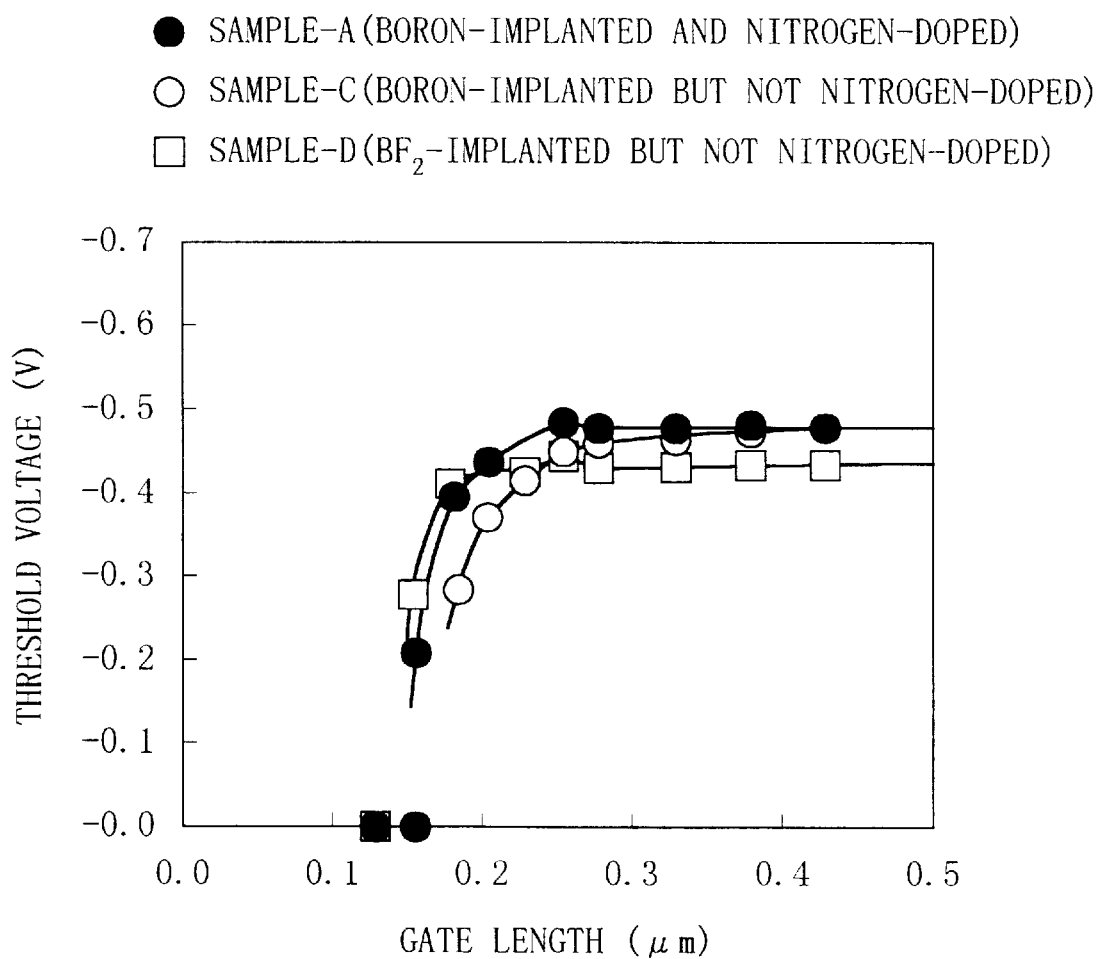
FIG. 11 shows data about the dependency of threshold voltage upon gate length for understanding the effect of the eighth embodiment of the present invention.
Figure 12:
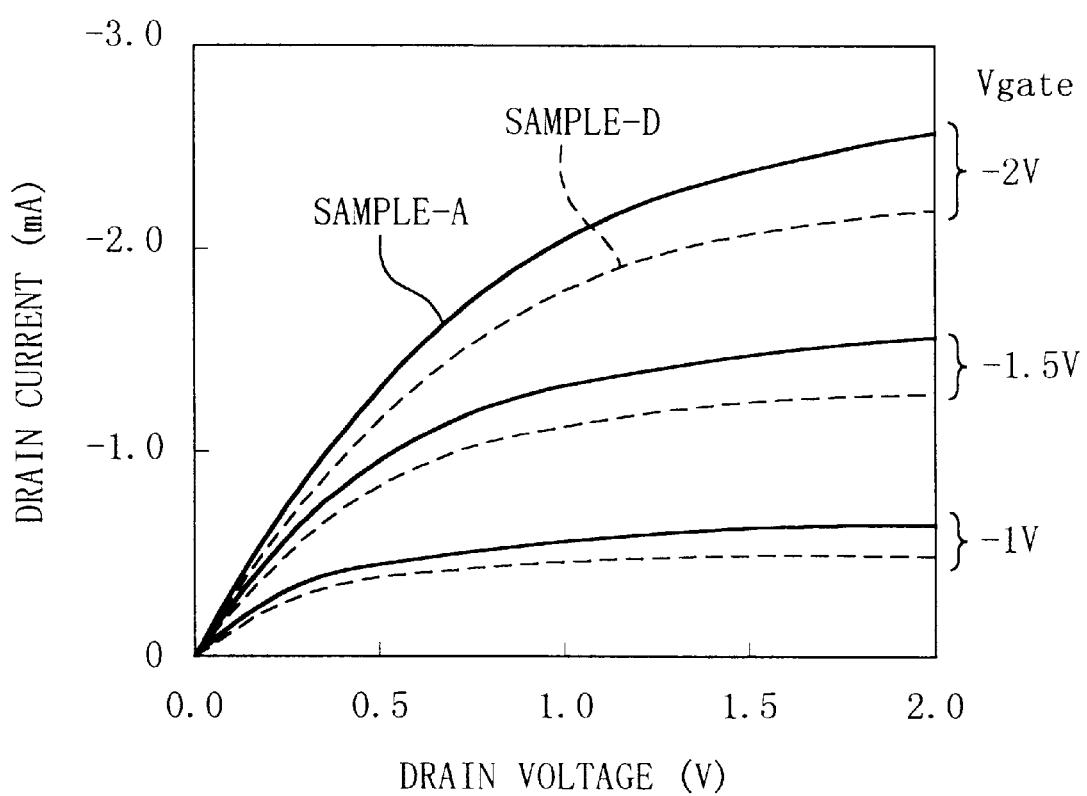
FIG. 12 shows data about the characteristic of saturation current for understanding the effect of the eighth embodiment of the present invention.
Figure 13:
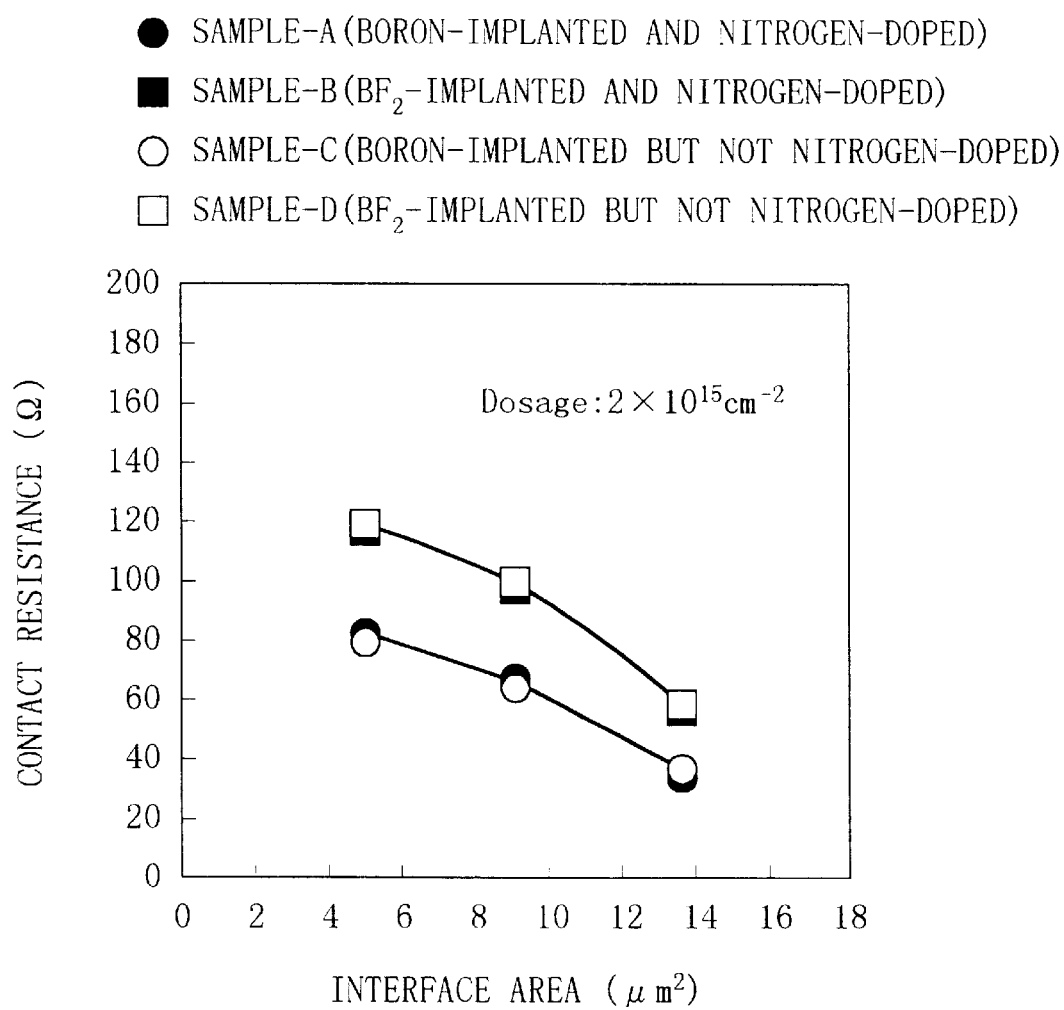
FIG. 13 shows data about the dependency of contact resistance upon the area of silicided region interface for understanding the effect of the eighth embodiment of the present invention.

FIG. 11 is a characteristic diagram showing dependency of the threshold voltage of SAMPLE-A, SAMPLE-C and SAMPLE-D upon the gate length. FIG. 11 shows that as the degree of variation in threshold voltage according to the gate length decreases the ability to control the short channel effect is enhanced. SAMPLE-A and SAMPLE-D were formed in such a way as to have approximately the same gate length and threshold voltage and their transistor characteristics (I–V characteristics) were measured. FIG. 12 shows the measurement results. SAMPLE-A, SAMPLE-B, SAMPLE-C and SAMPLE-D were formed such that each sample has a film of silicide over its source/drain region. FIG. 13 shows the variation in contact resistance of the silicide film/source/drain region interface for the area of the interface.

First, SAMPLE-A and SAMPLE-C, i.e., the samples which have been implanted with ions of boron at 10 keV, are compared. FIG. 11 shows that SAMPLE-A of the present embodiment, which has undergone a rapid thermal annealing treatment in an ambient of ammonia gas, provides an improved function of controlling short-channel effects as compared with SAMPLE-C which has undergone no rapid thermal annealing treatment in an ambient of ammonia gas. FIG. 11 further shows that SAMPLE-A has approximately the same short-channel effect controlling function as SAMPLE-D which has undergone no rapid thermal annealing treatment after an implant of $BF_2$ ions at 30 keV. SAMPLE-A is compared in transistor characteristic with SAMPLE-D, and, as can be seen from FIG. 12, the saturation drain current of SAMPLE-A is greater than that of SAMPLE-D by 15%, the reason for which may be explained as follows. One reason is that SAMPLE-A has a lower silicide film/source/drain region interface resistance than SAMPLE-D (see FIG. 13). Another reason is that the source/drain region resistance of SAMPLE-A is low because the skirt of the source/drain region profile is broadened by the boron 10-kev implant (in other words the impurity concentration of deep areas of the source/drain region of SAMPLE-A is high). To sum up, as compared with the MOS device not subjected to rapid thermal annealing in an ammonia gas ambient but subjected to a $BF_2$ ion implant, the present MOS device, although its short-channel controlling function is the same as that of the aforesaid MOS device, is able to provide a greater saturation drain current.

Figure 14:
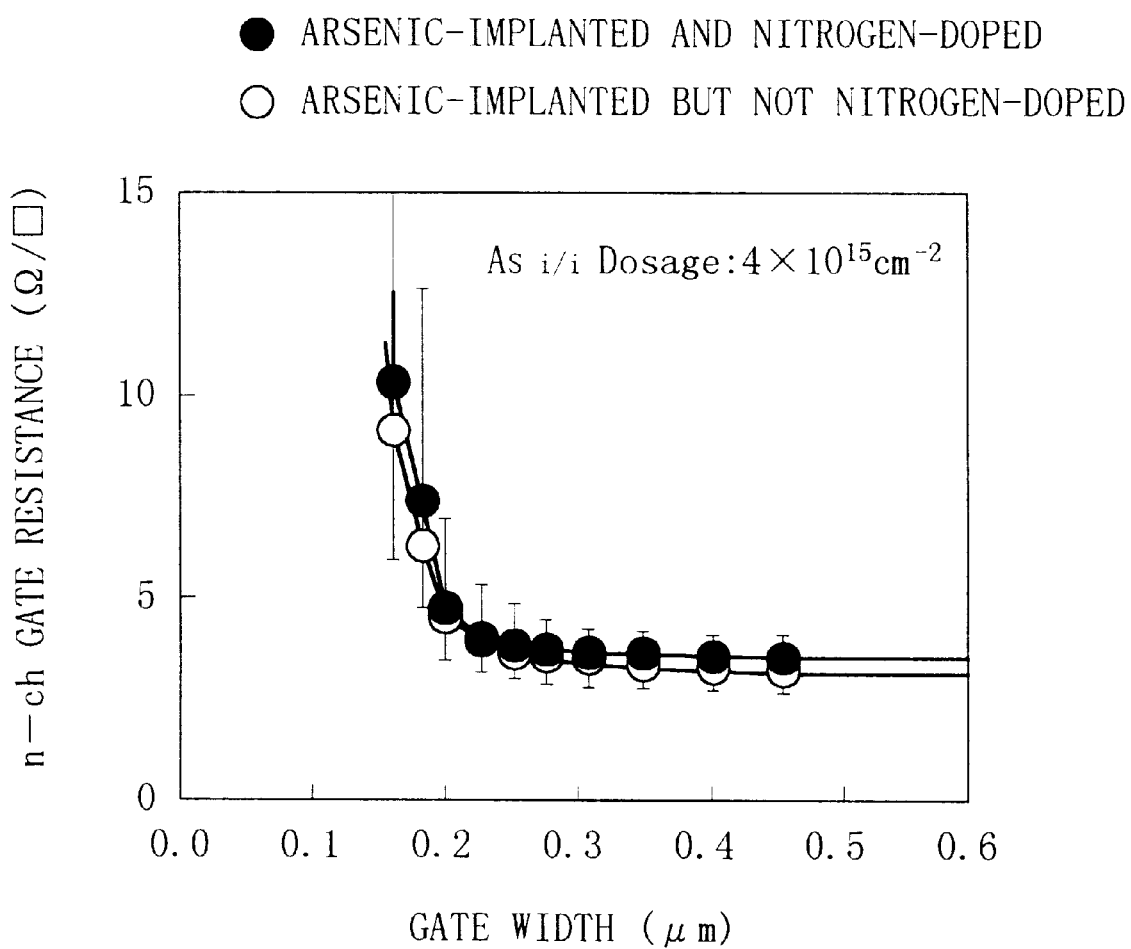
FIG. 14 shows data about the dependency of the gate resistance of transistor on the n channel side upon the gate width for understanding the effect of the eighth embodiment of the present invention.
Figure 15:
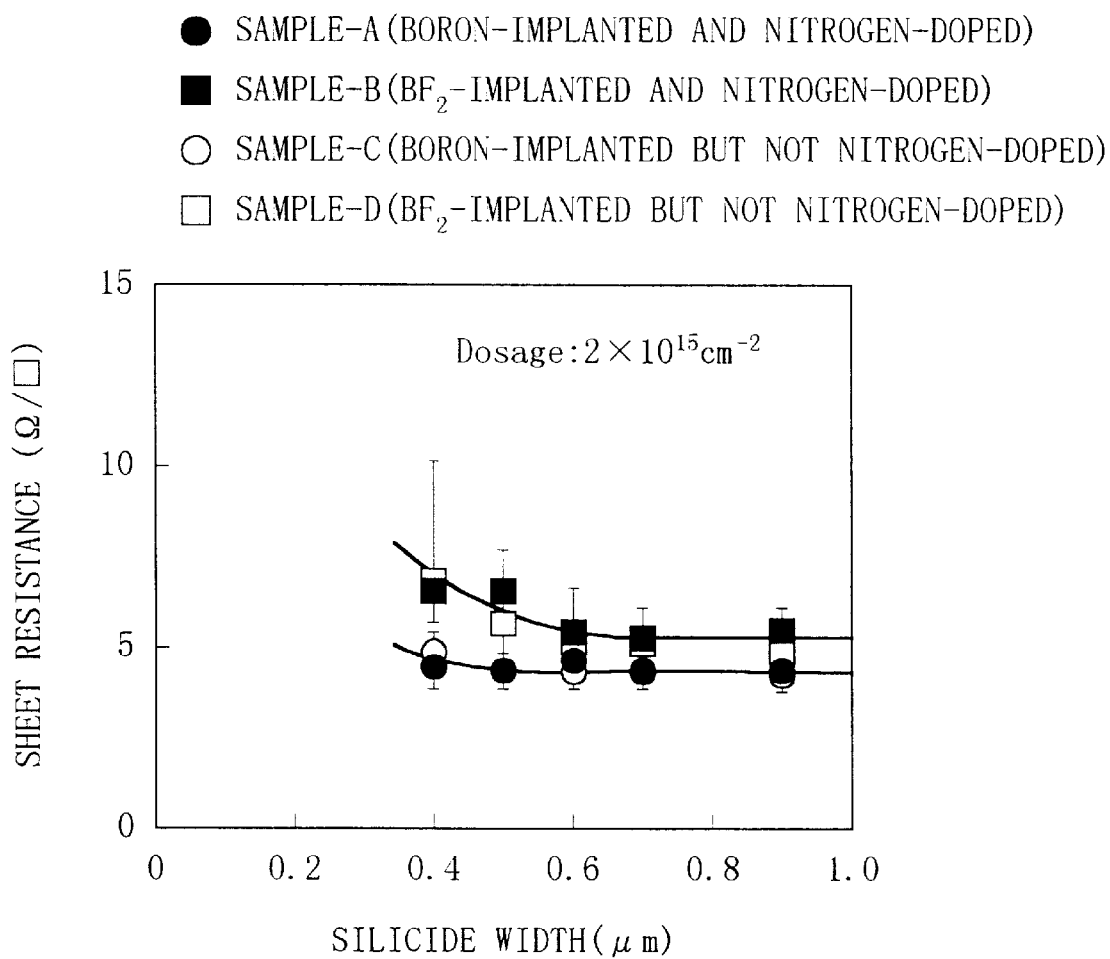
FIG. 15 shows data about the dependency of the sheet resistance upon the silicide width for understanding the effect of the eighth embodiment of the present invention.

In FIG. 14, an n-type MOSFET which has undergone a rapid thermal anneal after arsenic implantation and an n-type MOSFET which has undergone no rapid thermal anneal after arsenic implantation, are compared in dependency of the n-ch gate resistance upon the gate width. FIG. 15 shows the dependency of the sheet resistance of the source/drain region of each sample (p-type MOSFET) upon the silicide width. As shown in FIG. 14, the present embodiment's nitrogen doping produces no obstacles which prevent the aim of silicide technology (i.e., the achievement of lower resistance). Generally, it has been pointed out that nitrogen doping obstructs silicidation. However, the concentration of nitrogen used in the present embodiment is low enough to be negligible, therefore producing no obstacles to silicidation processing. Further, as can be seen from FIG. 15, the unwanted sheet resistance increase is relaxed by the nitrogen doping. It has been known in the art that $BF_2$ ion doping creates an impurity concentration peak value in the close vicinity of the surface, which produces the problem that silicide films are not formed in uniform fashion. On the other hand, boron doping creates a peak value slightly below the surface (immediately under an area that is silicided), so that uniform silicide film formation is not disturbed. Additionally, in the MOS device of the present embodiment, the impurity concentration of areas located immediately under a silicide film which plays the most important role for reduction of the sheet resistance, is increased. As a result, considerable reduction of the sheet resistance can be achieved.

It has been proved that the present embodiment is able to reduce junction leakage.

Structural features and advantages, resulting from nitrogen doping into the MOSFET source/drain region, are now described below.

Figure 16:
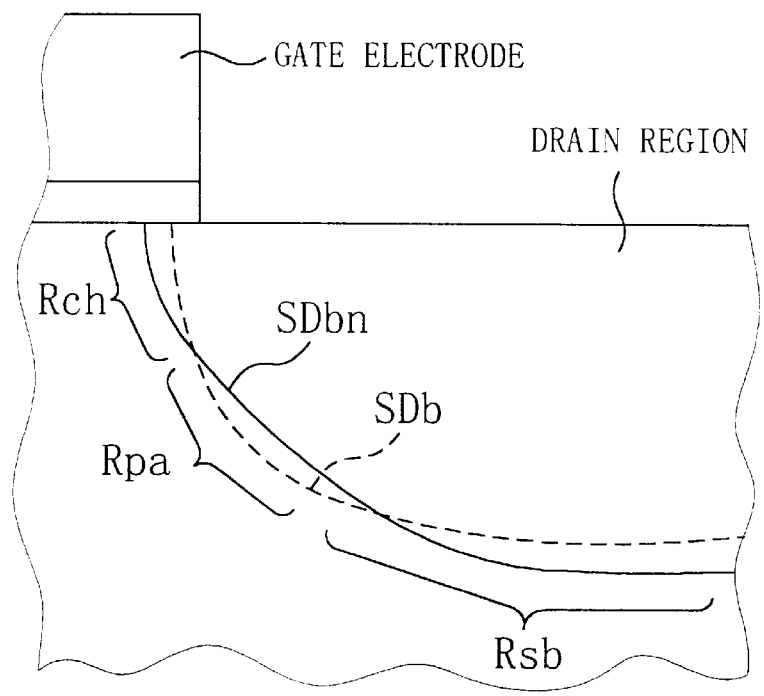
FIG. 16 is a cross-sectional view useful for understanding the difference between a source/drain region of a pMOS field effect transistor of the eighth embodiment and a source/drain region of a conventional pMOS field effect transistor formed by boron implantation only.
Figure 17:
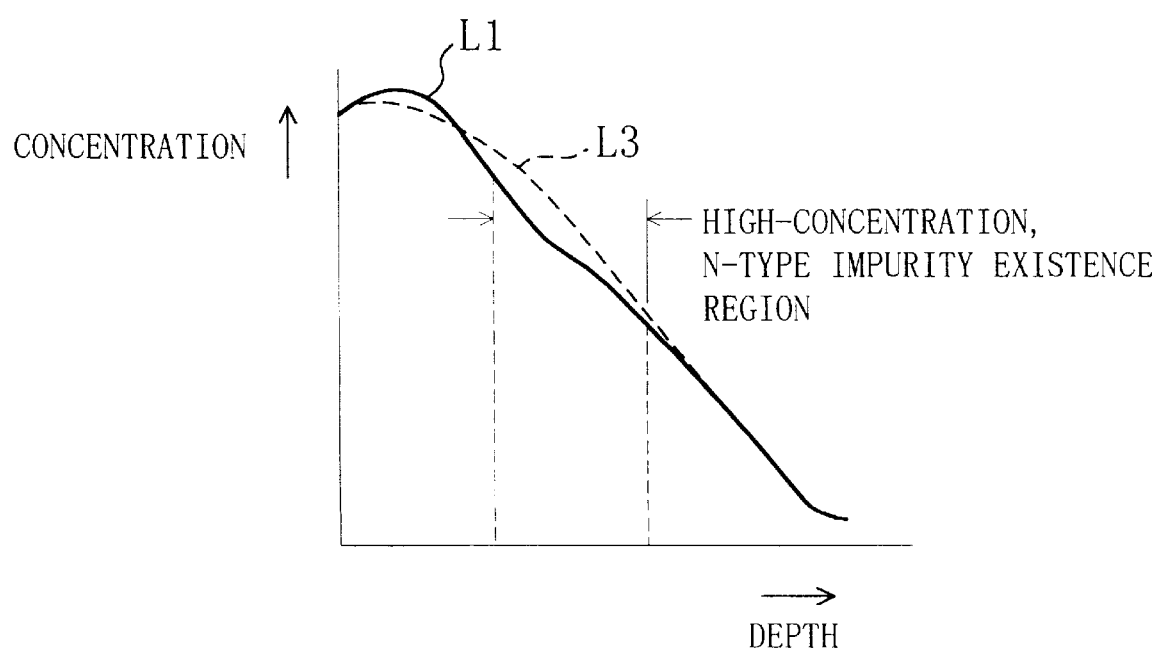
FIG. 17 is a diagram useful for understanding the reason of why there is produced the difference between a source/drain region of a pMOS field effect transistor of the eighth embodiment and a source/drain region of a conventional pMOS field effect transistor formed by implanting only boron.

FIG. 16 is a cross-sectional view illustrating a structure in the vicinity of typical source/drain and channel regions of a MOSFET. In the figure, only the drain region is shown and the source region is not shown since the source region generally has a symmetrical structure with the drain region. FIG. 17 is a graphical diagram about L1 and L3 of FIG. 8. The curve L1 shows the concentration distribution of a source/drain region of the present embodiment implanted with both boron and nitrogen, for the substrate depth direction. The curve L3 shows the concentration distribution of a conventional source/drain region implanted with only boron with respect to the substrate depth direction. As shown in FIG. 16, a conventional source/drain region SDb by boron implantation generally has a form indicated by broken line, which is explained as follows. Generally speaking, impurity diffusion including diffusion by ion implantation and diffusion by annealing uniformly proceeds from the diffusion source at constant speed in each direction. In such a case, the source/drain region surface is a source where diffusion begins, so that in the FIG. 16 cross-section diffusion starts from a linear diffusion source. On the other hand, a source/drain region SDbn of the present embodiment has a form indicated by solid line in the figure. Such a difference in form between the conventional and present source/drain regions may result from the following reasons.

The source/drain region can be divided roughly into three regions, namely a region Rch located adjacent to the channel region, a region Rpa which becomes a direction in which punch-through occurs and a region Rsb which is a bottom region located next to the substrate region. The semiconductor substrate is doped with n-type impurities such as arsenic and phosphorus for the control of threshold voltage as well as with n-type impurities for the prevention of punch-through. These heavily-doped n-type regions are located in a range of the semiconductor substrate at a particular depth from the substrate surface (see FIG. 17). The source/drain region SDbn of the present embodiment therefore has the following geometric features over the conventional source/drain region SDb. The impurity concentration of source/drain region SDbn is higher than that of source/drain region SDb in the region Rch near the substrate surface, so that the source/drain region SDbn more protrudes towards the channel region than the source/drain region SDb. This may be explained as follows. Heavily-doped area can be limited to exist in a narrow range in the vicinity of the substrate surface, which makes it possible to perform an implant of impurity ions for formation of a source/drain region at a greater implant energy than in a case in which nitrogen is not doped. Since the impurity concentration of the source/drain region SDb rapidly drops after the peak value, the effect of reduction of the carrier formation by n-type impurities is enhanced particularly in the region Rpa located at a greater depth than the channel region. Therefore, the region Rpa is more set back in the direction away from the channel region in comparison with the conventional MOSFET'S source/drain region SDb. Further, as described above, because of the ability to perform an ion implant at an implant energy of greater level, the bottom region Rsb is located at a greater depth than the source/drain region SDb with no nitrogen doping. In other words, the concentration distribution of the source/drain region SDbn at deep areas of the substrate shows a broad distribution as compared with one without nitrogen doping. The source/drain region SDbn deepens accordingly.

Accordingly, the present embodiment provides MOSFETs which have the following operational advantages. One of these advantages is that the protrusion of the region Rch in the vicinity of the substrate surface produces reduced parasitic capacitance. The region Rpa immediately below the region Rch is set back, whereby resistance to punch-through is enhanced and the ability to control the short-channel effect increases. Further, the region Rpa has a gentle inclination and parasitic capacitance is reduced.

In the above description, the pocket is not explained. The presence of the pocket contributes to the setting back of the region Rpa (FIG. 16). However, it is to be noted that it is basically possible to obtain the FIG. 16 impurity concentration profile without having to form a pocket region. The fabrication may be simplified by omitting the steps of forming a pocket.

In the present embodiment, Ti self-aligned-silicidation processing is described as a means for achieving low resistance. However, the same effects as obtained in the Ti self-aligned-silicidation can be expected using other self-aligned-silicidation such as Co self-aligned-silicidation and Ni self-aligned-silicidation or by other ways such as tungsten bonding by selective tungsten deposition.

Different implant parameters for boron and $BF_2$ may provide the same effects as obtained in the present embodiment.

The diffusion layer may be formed by the implanting of various impurities other than boron, such as phosphorus, arsenic, indium and antimony. This applies in controlling the diffusion of impurity such as fluorine which does not form a diffusion layer.

Rapid thermal annealing in an ambient of, for example, nitrogen or argon may provide the same effects as obtained by rapid thermal annealing in an ambient of ammonia gas. It is deemed preferable to dope, as a second impurity, nitrogen separately from boron.

The same effects may be expected not only in silicon substrate but also in polysilicon.

In the present embodiment, the effect of doping nitrogen into a source/drain region or into an extension of a source/drain region has been described. Doping nitrogen into a well or into a channel region also provides an effect of controlling the diffusion of impurities for carrier formation, as in the present embodiment.

Ninth Embodiment

FIGS. 18(a)–(d) are cross-sectional views showing process steps used in the fabrication of a MOSFET of a ninth embodiment of the present invention.

Figure 18A:
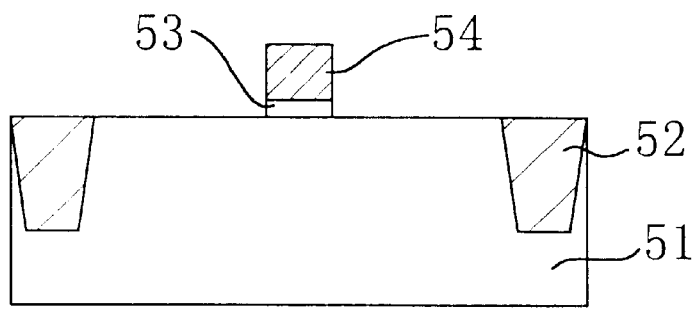
FIGS. 18(a)–(d) are cross-sectional views illustrating process steps used in the fabrication of a pMOS field effect transistor in accordance with a ninth embodiment of the present invention.

In a process step shown in FIG. 18(a), element isolator 52 is formed in a portion of silicon substrate 51. Gate oxide film 53 and gate electrode 54 are formed overlying an active region surrounded by element isolator 52. Gate oxide film 53 and gate electrode 54 are formed under the same formation conditions as used in each of the foregoing embodiments.

Figure 18B:
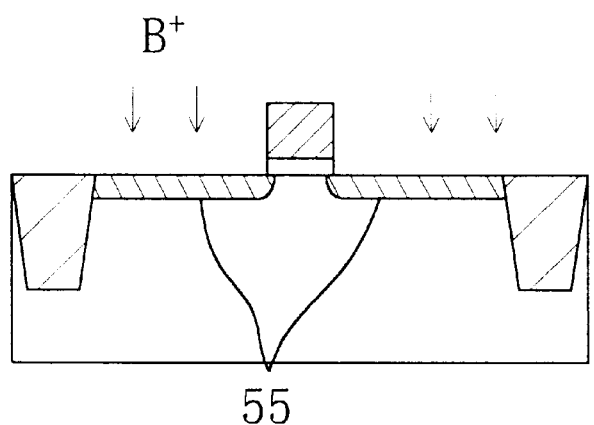

In a process step shown in FIG. 18(b), a boron (B+) implant is performed, to form extension 55 for a source/drain region. Extension 55 is formed under the same formation conditions as used in the eighth embodiment.

Figure 18C:
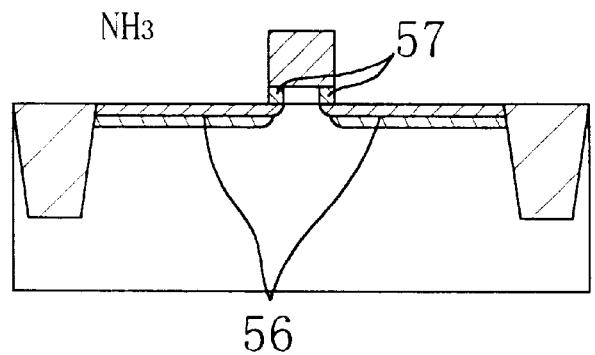

In a process step shown in FIG. 18(c), an anneal is performed in an ambient of ammonia gas, to dope nitrogen ions into the silicon substrate. At this time, as compared with the eighth embodiment, either the processing time is shortened or the processing temperature is lowered, in order that high-concentration nitrogen is doped into shallower areas than the ones implanted with nitrogen in the eighth embodiment. By this processing, nitrogen diffusion layer 56 is formed at a near-surface area of extension region 55. At the same time, oxynitride layer 57 is formed at each edge of gate oxide film 53.

Figure 18D:
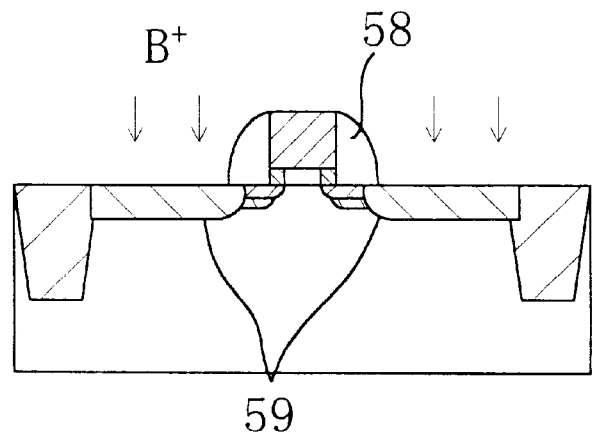
Figure 19A:
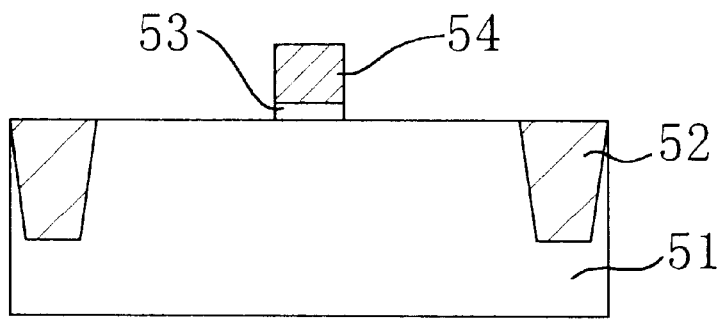
FIGS. 19(a)–(d) are cross-sectional views illustrating process steps used in the fabrication of a pMOS field effect transistor in accordance with a tenth embodiment of the present invention.
Figure 19B:
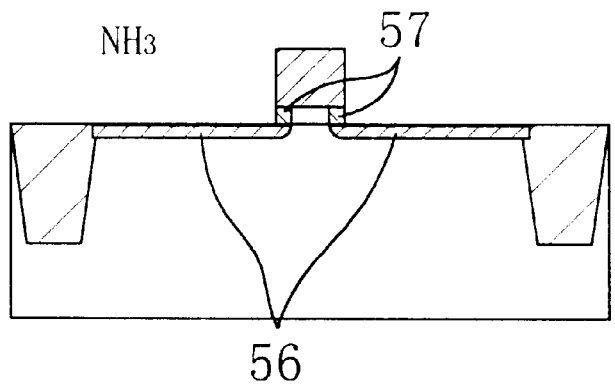
Figure 19C:
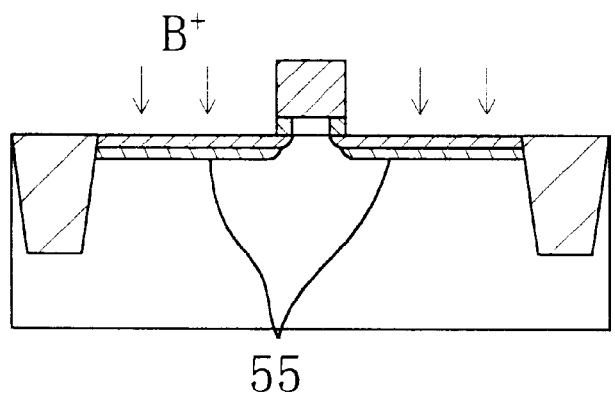
Figure 19D:
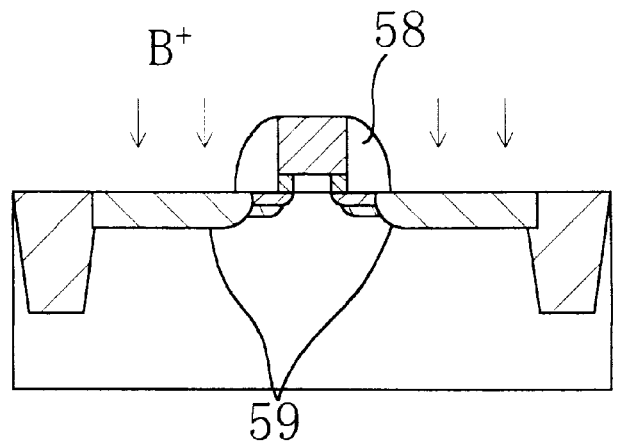

In a process step shown in FIG. 18(d), sidewall 58 is formed on each side surface of gate electrode 54. This is followed by a boron implant into the silicon substrate to form source/drain region 59 under the same formation conditions as used in the eighth embodiment.

An annealing treatment is carried out for impurity activation, whereby extension 55 and source/drain region 59 are defined.

It is preferred that the steps of forming a film of silicide over the source/drain region and over the gate electrode are performed. However, the formation of such a silicide film may be omitted.

In the present embodiment, relatively heavily-doped areas of extension 55 exist only on the surface region, thereby making it possible to form a shallow pn junction in the channel region and channel resistance is reduced. Additionally, oxynitride layer 57 is formed at each edge of the gate oxide film, which, as in the first embodiment, provides improved reliability. The formation of a silicide film over the source/drain region, of course, makes it possible to considerably reduce contact resistance, as in the eighth embodiment.

Although the present embodiment has been described with reference to the formation of p-type MOSFET, it is not intended that the present embodiment be limited thereto. For instance, by arrangement that (a) a p-type silicon substrate is provided and (b) an implant of ions of arsenic is performed in forming a source/drain region and an extension, the fabrication method of the present embodiment becomes applicable to n-type MOSFETs. Even in such a case, it is possible to form a shallow pn junction in the channel region, thereby reducing channel resistance as well as improving reliability.

Additionally, instead of performing an annealing treatment in an ambient of ammonia gas, impurities may be introduced into a substrate by nitrogen plasma processing.

Tenth Embodiment

FIGS. 19(a)–(d) are cross-sectional views illustrating process steps used in the fabrication of a MOSFET in accordance with a tenth embodiment of the present invention.

The present embodiment is basically identical with the ninth embodiment, with the exception that in the present embodiment nitrogen diffusion layer 56 is formed before formation of extension 55. The present and ninth embodiments provide the same advantages and can be modified in the same way.

Eleventh Embodiment

FIGS. 20(a)–(d) are cross-sectional views illustrating process steps used in the fabrication of a MOSFET according to an eleventh embodiment of the present invention.

Figure 20A:
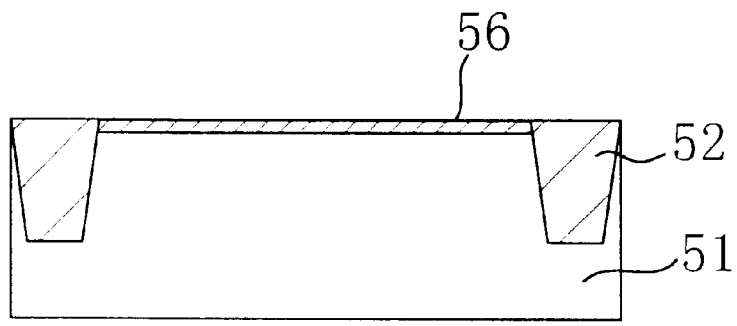
FIGS. 20(a)–(d) are cross-sectional views illustrating process steps used in the fabrication of a pMOS field effect transistor in accordance with an eleventh embodiment of the present invention.

In a process step shown in FIG. 20(a), element isolator 52 is formed in a portion of silicon substrate 51. An anneal is performed in an ambient of ammonia gas, to introduce nitrogen ions into a near-surface area of an active region surrounded by element isolator 52. At this time, as compared with the eighth embodiment, either the processing time is shortened or the processing temperature is lowered, in order that high-concentration nitrogen is introduced to shallower areas than the ones doped with nitrogen in the eighth embodiment. By this processing, nitrogen diffusion layer 55 is formed at an area in the vicinity of the surface of the active region. No gate oxide film 53 has been formed so far, and therefore no oxynitride layer 57 has been formed at each edge of gate oxide film 53, either, unlike the ninth and tenth embodiments.

Figure 20B:
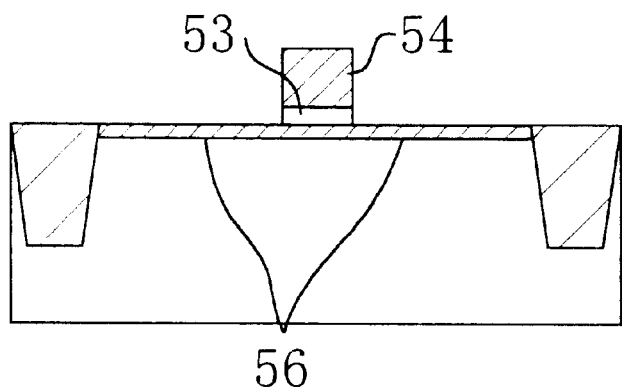

In a process step shown in FIG. 20(b), gate oxide film 53 and gate electrode 54 are formed on the active region. The conditions of forming gate oxide film 53 and gate electrode 54 in this process step may be the same as used in each of the foregoing embodiments.

Figure 20C:
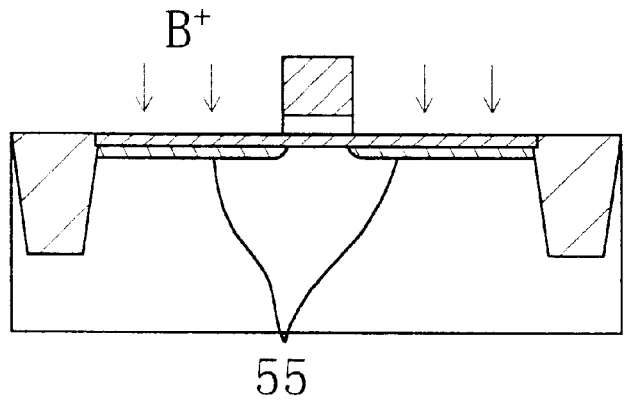

In a process step shown in FIG. 20(c), a boron (B+) implant is carried out, to form extension 55 of a source/drain region. The conditions of forming extension 55 in this process step may be the same as used in the eighth embodiment.

Figure 20D:
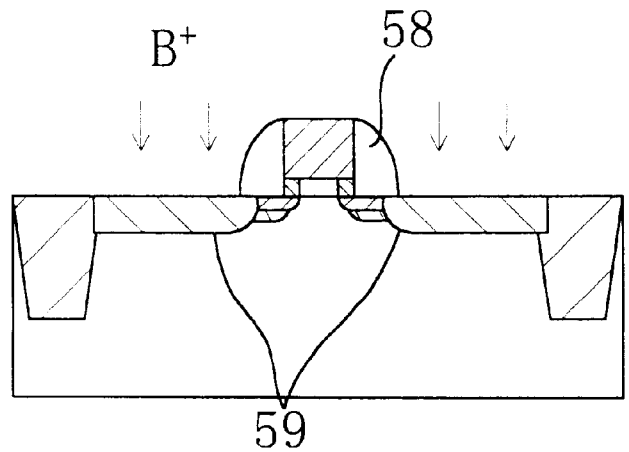

In a process step shown in FIG. 20(d), sidewall 58 is formed on each side surface of gate electrode 54. This is followed by an implant of ions of boron into the silicon substrate, to form source/drain region 59. The conditions of forming source/drain region 59 may be the same as the ones used in the eighth embodiment.

Thereafter, an anneal is carried out, whereby extension 56 and source/drain region 59 are defined.

In the present embodiment, relatively heavily-doped areas of extension 55 exist only on the surface region, thereby making it possible to form a shallow pn junction in the channel region and channel resistance is reduced. Additionally, if a silicide film is formed overlying the source/drain region, which, of course, provides improved reliability and reduced contact resistance, as in the eighth embodiment.

Although the present embodiment has been described with reference to the formation of p-type MOSFET, it is not intended that the present embodiment be limited thereto. For instance, by arrangement that (a) a p-type silicon substrate is provided and (b) an implant of ions of arsenic is performed in forming a source/drain region and an extension, the fabrication method of the present embodiment becomes applicable to n-type MOSFETs. Even in such a case, it is possible to form a shallow pn junction both in the channel region and in the extension, thereby reducing channel resistance as well as improving reliability.

Additionally, instead of performing an annealing treatment in an ambient of ammonia gas, impurities may be introduced into a substrate by nitrogen plasma processing.

Twelfth Embodiment

FIGS. 21(a)–(d) are cross-sectional views showing process steps used in the fabrication of a vertical npn bipolar transistor in accordance with a twelfth embodiment of the present invention.

Figure 21A:
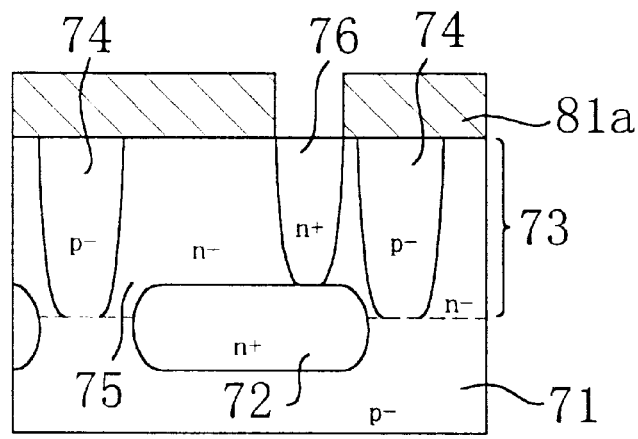
FIGS. 21(a)–(c) are cross-sectional views illustrating process steps used in the fabrication of an npn bipolar transistor in accordance with a twelfth embodiment of the present invention.

In a process step shown in FIG. 21(a), an implant of an n-type impurity is performed into a near-surface area of silicon substrate 71, to form n-type buried collector layer 72. Subsequently, n-type epitaxial layer 73 is grown overlying the entire surface of the substrate. P-type spacer 74 is formed within n-type epitaxial layer 73. Through photoresist film 81a serving as a mask, a high-concentration n-type impurity is implanted into a region surrounded by p-type spacer 74 (i.e., a portion of collector layer 75), to form n-type collector wall layer 76.

Figure 21B:
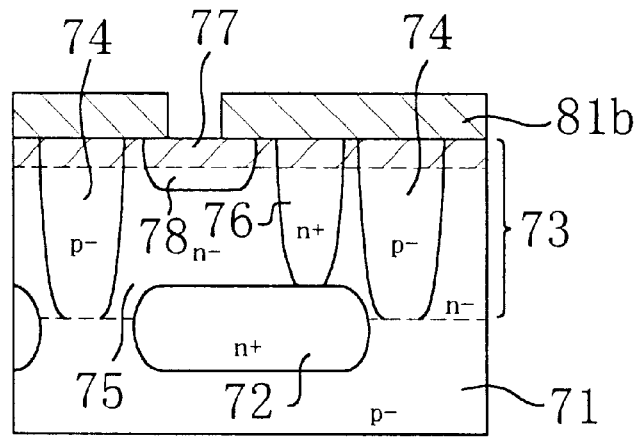

Next, in a process step shown in FIG. 21(b), photoresist film 81a is stripped and thereafter an anneal is performed in an ambient of ammonia gas, to form nitrogen diffusion layer 77 to a greater depth than in the eighth embodiment, more specifically, in an area including a base layer that is formed later. The conditions of this annealing treatment are as follows: the ammonia gas flow rate is about 5 slm, the annealing temperature is about 950 degrees centigrade and the annealing time is about 30 seconds. Ions of boron of light concentration are implanted into a portion of collector layer 75 at an implant energy of approximately 30 keV at a dosage of about $2 \times 10^{13} \text{cm}^{-2}$, in which photoresist film 81b serves as a mask, to form p-type base layer 78.

Figure 21C:
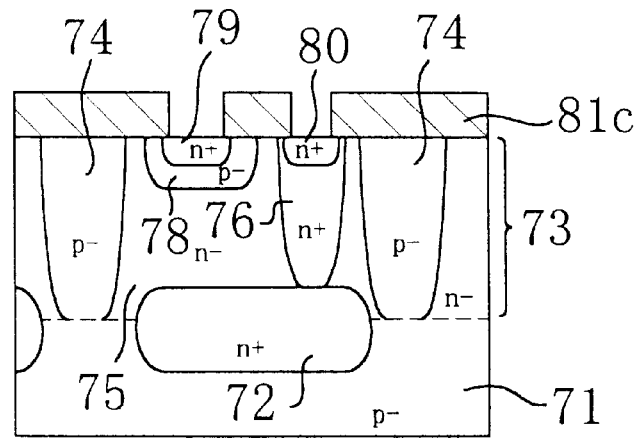
Figure 22A:
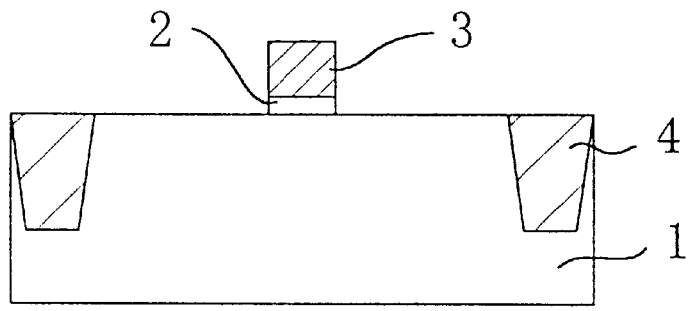
FIGS. 22(a)–(d) are cross-sectional views illustrating process steps employed in the fabrication of an nMOS field effect transistor in accordance with a prior art technique.
Figure 22B:
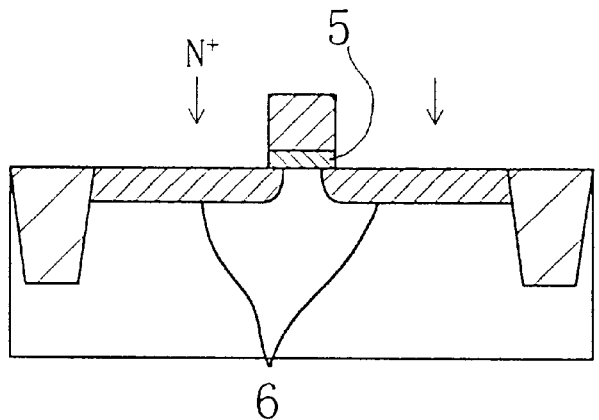
Figure 22C:
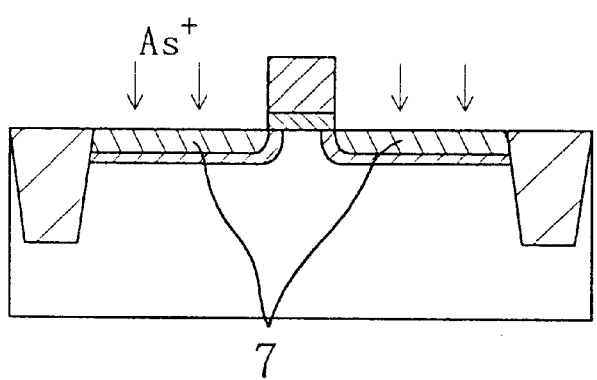
Figure 22D:
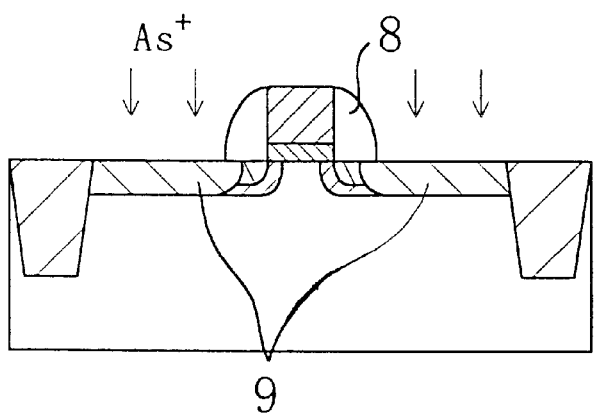
Figure 23:
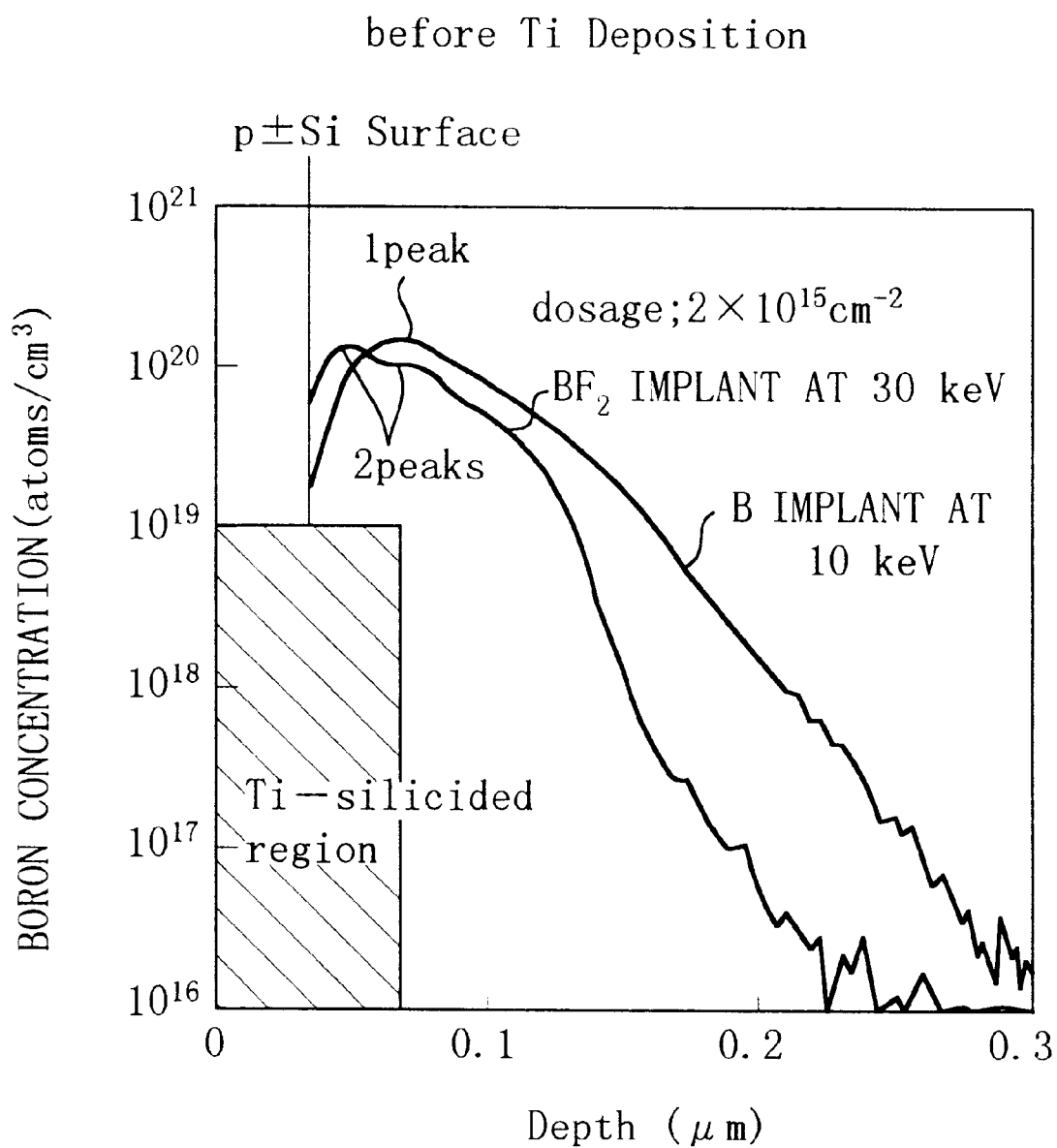
FIG. 23 shows concentration profiles for boron and $BF_2$ in a source/drain region of a conventional pMOS field effect transistor.
Figure 24:
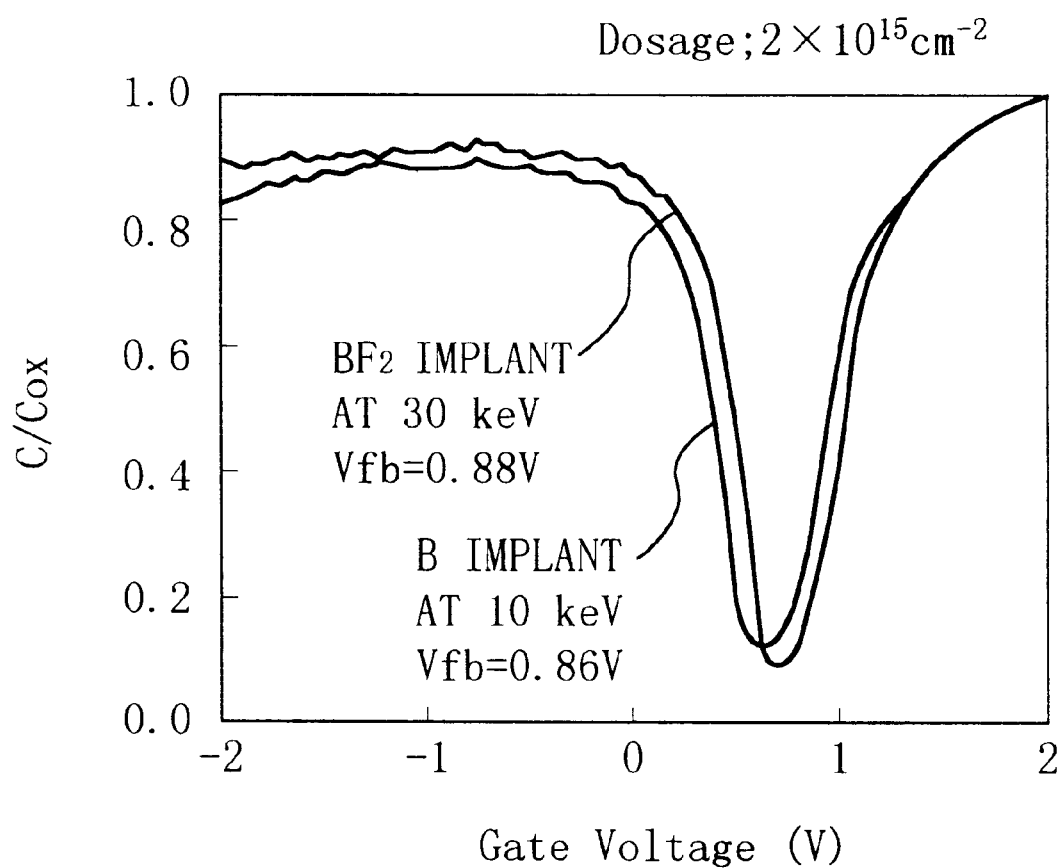
FIG. 24 shows the quasi static C-V characteristic of a conventional pMOS field effect transistor having a source/drain region formed by implantation of boron and $BF_2$.
Figure 25:
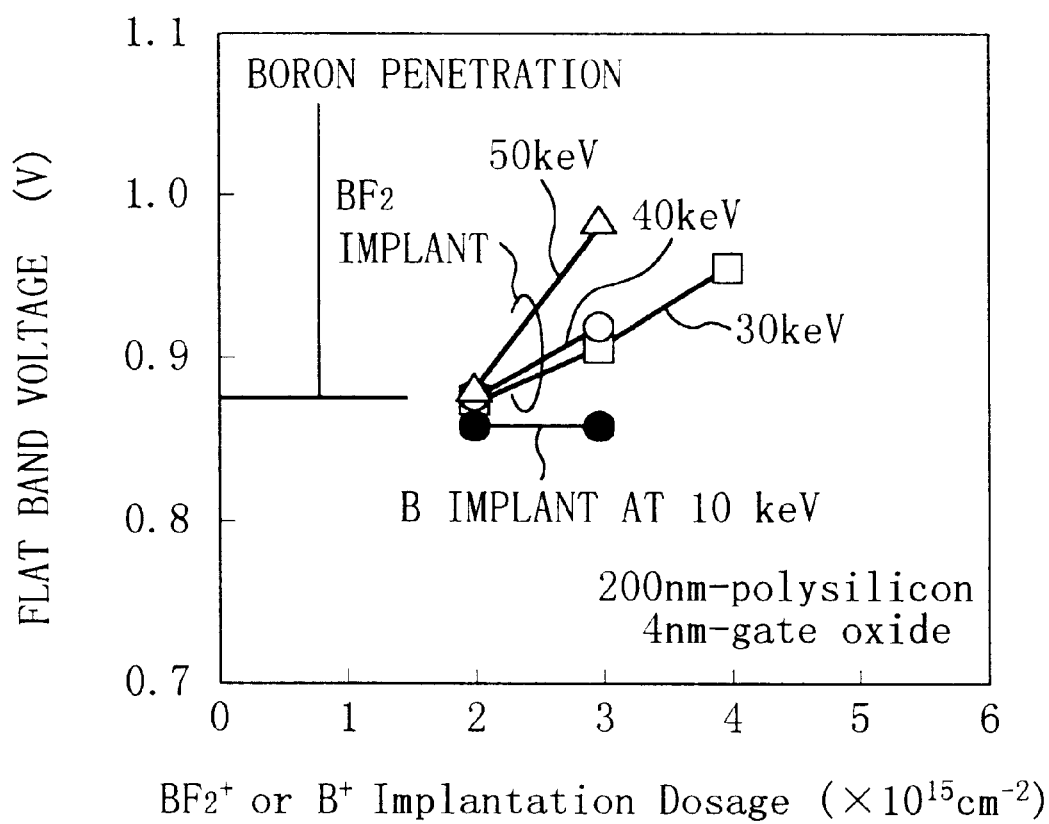
FIG. 25 is a diagram showing the dependency of the flat band voltage of conventional pMOS field effect transistor upon the dosage of boron and $BF_2$.

In a process step shown in FIG. 21(c), through photoresist film 81c serving as a mask, ions of arsenic of high concentration are implanted into base layer 77 and into collector wall layer 76, to form n-type emitter layer 79 and collector contact layer 80.

Thereafter, an anneal is carried out for activation of the impurities introduced into the individual layers.

In the present embodiment, nitrogen diffusion layer 77 is formed in base layer 78, so that boron diffusion in base layer 78 is controlled at the time of the annealing treatment for impurity activation. As a result, base layer 78 is formed having a relatively high concentration and a thin film thickness and base resistance is reduced. It is known that $f_T$, which gives the limits of high frequency of the emitter ground circuit, varies proportionally with $D/W^2$ where W is the base region width (the thickness in the present embodiment) and D is the diffusion constant. The present embodiment provides the advantage that the cutoff frequency ($f_T$) of bipolar transistors can be increased. Additionally, the additional formation of a nitrogen diffusion layer in the emitter layer makes it possible to increase the surface concentration thereof, thereby providing an improved current amplification rate by reduction of the emitter resistance.

The present embodiment has been described with reference to an example in which a nitrogen diffusion layer is formed in a base layer as well as in an emitter layer. A nitrogen diffusion layer may be formed only in an emitter layer or in a base layer of a bipolar transistor.

MODIFICATIONS

In the process steps shown in FIGS. 3(a), 4(a), 5(a) and 6(a) or prior to these process steps, nitrogen may be doped to a silicon substrate either by performing an annealing process in an ambient of a nitrogen gas or ammonia gas containing therein nitrogen or by performing a plasma nitriding process. In such a case, the same effects that each of the ninth to eleventh embodiment achieves are obtained. An anneal is carried out in an ambient of $NH_3$ gas at a temperature of 800 degrees centigrade for 15 seconds. Thereafter, by performing the same process steps as in each of the foregoing embodiments, a device, which has the same structure and the same functions as the ones fabricated in accordance with each of the foregoing embodiments, can be formed. Also, in the other embodiments, by performing such processing instead of performing nitrogen ion doping, the same effects that each of the foregoing embodiments achieves can be obtained.

If thermal nitriding is performed either in an ambient of $N_2$ gas at temperatures ranging from 1000 to 1200 degrees centigrade for 30 minutes or in an ambient of $NH_3$ gas at temperatures ranging from 600 to 800 degrees centigrade for from 10 to 30 seconds, this thermal annealing treatment produces an oxynitride layer in a gate oxide film having the same functions as the one formed by the first embodiment.

The conditions of the plasma nitriding are as follows: the flow rate of $N_2$ gas is from 10 to 100 ccm, the gas pressure is from 10 to 300 mTorr and the high-frequency power is from about 50 to about 300 W. Thereafter, by performing the same process steps as carried out in each of the embodiments, a semiconductor device is produced having the same structure and the sam functions as the one formed in each of the embodiments.

The invention claimed is:

1. A method of fabricating a semiconductor device having a MIS-type field effect transistor, said semiconductor device fabrication method comprising the steps of:
   (a) a first step of forming on a semiconductor substrate an element isolator which encloses an active region;
   (b) a second step of depositing on said active region an oxide film and a conductor film;
   (c) a third step of patterning said oxide film and said conductor film to form a gate oxide film and a gate electrode for said MIS-type field effect transistor;
   (d) a fourth step of forming a shallow nitrogen diffusion layer and an oxynitride layer by doping nitrogen into said active region at at least a portion thereof where a drain region is to be formed and into at least one of edges of said gate oxide film located on a drain formation side; and
   (e) a fifth step of forming a lightly-doped source region and a lightly-doped drain region for said MIS-type field effect transistor by doping an impurity of a first conductivity type into areas of said active region located on opposite sides of said gate electrode, such that at least said lightly-doped drain region extends under said shallow nitrogen diffusion layer.

2. A semiconductor device fabrication method as in claim 1,
   wherein said fourth step is performed after said third step and before said fifth step and
   wherein said shallow nitrogen diffusion layer and said oxynitride layer are formed by performing an implant of nitrogen ions in which said nitrogen ions are implanted from directions including at least a direction with a tilt towards said drain region.

3. A semiconductor device fabrication method as in claim 2, wherein an implant of nitrogen ions is performed in said fourth step in which said nitrogen ions are implanted from a direction with a tilt angle of 10 degrees or more to a direction perpendicular to a surface of said semiconductor substrate in a cross section in parallel with the channel direction of said transistor.

4. A semiconductor device fabrication method as in claim 1, wherein an implant of nitrogen ions is performed in said fourth step in which said nitrogen ions are implanted from directions including at least two directions or more including a direction with a tilt towards said drain region and a direction with a tilt towards said source region.

5. A semiconductor device fabrication method as in claim 1, wherein said fourth step is carried out by subjecting said semiconductor substrate to a thermal annealing treatment in an ambient of gas including at least nitrogen.

6. A semiconductor device fabrication method as in claim 5, wherein said fourth step is carried out in an ambient of ammonia gas.

7. A semiconductor device fabrication method as in claim 1, wherein said fourth step is carried out by generating plasmas in an ambient of gas including nitrogen.

8. A semiconductor device fabrication method as in claim 1, said semiconductor device fabrication method further comprising the steps of:

forming an insulator sidewall on each side surface of said gate electrode; and forming heavily-doped source/drain regions by doping in which, through said gate electrode and said insulator sidewall serving as a mask, a high-concentration impurity of a first conductivity type is introduced into said semiconductor substrate, wherein said steps are performed after said fifth step.

9. A semiconductor device fabrication method as in claim 8, wherein said semiconductor device fabrication method further comprises forming over said heavily-doped source and drain regions a low-resistance film including at least a metal.

10. A semiconductor device fabrication method as in claim 1 wherein in said second step an insulation film is deposited on said conductor film and wherein in said third step said insulation film is patterned simultaneously with said conductor and oxide films, to form an over-gate insulation film on said gate electrode.

11. A semiconductor device fabrication method as in claim 1, wherein:

(a) in said first step, separate element isolators are formed enclosing a first active region for formation of an nMIS-type field effect transistor and a second active region for formation of a pMIS-type field effect transistor, respectively;

(b) in said second step, an oxide film and a conductor film are formed on each of said first and second active regions;

(c) in said third step, said oxide films and said conductor films are patterns so as to form gate oxide films and gate electrodes for said nMIS- and pMIS-type field effect transistors on said first and second active regions;

(d) in said fourth step, an oxynitride layer is formed at at least one of edges of said gate oxide film of said nMIS-type field effect transistor on the drain formation side, and a shallow nitrogen diffusion layer is formed in said nMIS-type field effect transistor at at least a portion thereof where a drain region is to be formed; and (e) in said fifth step, areas on opposite sides of said gate electrode of said first active region are doped with an impurity of a first conductivity type to form a lightly-doped source region and a lightly-doped drain region for said nMIS-type field effect transistor, and areas on opposite sides of said gate electrode of said second active region are doped with an impurity of a second conductivity type to form a lightly-doped source region and a lightly-doped drain region for said pMIS-type field effect transistor.

12. A semiconductor device fabrication method as in claim 11, wherein:

(a) after said third step and before said fifth step, said semiconductor fabrication method further includes forming a first mask which covers said second active region; and (b) with said first mask applied on said second active region, an ion implant is performed from above said first active region in which ions of nitrogen are implanted from directions including at least a direction with a tilt toward said drain region, to form said shallow nitrogen diffusion layer and said oxynitride layer, in said fourth step.

13. A semiconductor device fabrication method as in claim 11, wherein:

said semiconductor device fabrication method further includes:

after said third step and before said fifth step, forming a second mask which covers said first active region;

with said second mask applied onto said first active region, performing an ion implant in which ions of nitrogen are implanted into said second active region at approximately right angles to a surface of said semiconductor substrate.

14. A semiconductor device fabrication method as in claim 11, wherein:

(a) in said second step, an insulation film is deposited on said conductor film; and (b) in said third step, said insulation film is patterned simultaneously with said conductor and oxide films, to form an over-gate insulation film on said gate electrode of each said first and second active region.

15. A method of fabricating a semiconductor device, said semiconductor device fabrication method comprising the steps of:

(a) a first step of forming a first impurity diffusion layer by doping an impurity for carrier generation into a semiconductor region of a semiconductor substrate;

(b) a second step of forming a shallow nitrogen diffusion layer which is shallower than said first impurity diffusion layer by introducing into a semiconductor region of said semiconductor substrate wherein either of rapid annealing treatment and plasma treatment is conducted on said semiconductor substrate while maintaining said semiconductor substrate in an ambient of gas including at least nitrogen;

(c) a third step of making said carrier generation impurity active by conducting heat treatment at a hither temperature than either of said rapid annealing treatment and said plasma treatment on said semiconductor substrate having said first impurity diffusion layer and said nitrogen diffusion layer formed thereon;

wherein:
either one of said first and second steps is performed prior to the other such that said first impurity diffusion layer and said nitrogen diffusion layer at least overlap with each other.

16. A semiconductor device fabrication method as in claim 15, wherein said second step is carried out in an ambient of ammonia gas.

17. A semiconductor device fabrication method as in claim 16, wherein in said second step, rapid annealing treatment is carried out at a temperature of 900 degrees centigrade or more for ten seconds or less.

18. A semiconductor device fabrication method as in claim 15, wherein:
(a) a region for formation of a MIS-type field effect transistor is provided in said semiconductor substrate;
(b) said semiconductor device fabrication method further comprises forming on said MIS-type field effect transistor formation region a gate insulation film and a gate electrode; and
(c) in said first step, after said gate insulation film and gate electrode are formed, areas of said MIS-type field effect transistor formation region, located on opposite sides of said gate electrode, are doped with said carrier generation impurity, to form a source region and a drain region for said MIS-type field effect transistor.

19. A semiconductor device fabrication method as in claim 18, wherein:
(a) in said gate insulation film/gate electrode formation step, a gate insulation film of oxide is formed; and
(b) said second step is performed after said gate insulation film/gate electrode formation step, in which nitrogen is doped also into both edges of said gate insulation film.

20. A semiconductor device fabrication method as in claim 18, wherein:
(a) said semiconductor device fabrication method further includes after said gate insulation film/gate electrode formation step and before said first step:
forming an extension region by doping, into said MIS-type field effect transistor formation region, a second impurity for carrier generation having a lower concentration than and the same conductivity type as said carrier generation impurity doped into said source and drain regions;
forming an insulator sidewall on each side surface of said gate electrode;
(b) in said first step, said carrier generation impurity is introduced into areas of said MIS-type field effect transistor formation region located on opposite sides of said gate electrode; and
(c) in said second step, said nitrogen diffusion layer is formed including at least a portion of said extension region.

21. A semiconductor device fabrication method as in claim 20 further includes, after said gate insulation film/gate electrode formation step and before said first step, forming a pocket region by doping, into said MIS-type field effect transistor formation region, a third impurity for carrier generation having a lower concentration than and the opposite conductivity type to said carrier generation impurity doped into said source and drain regions.

22. A semiconductor device fabrication method as in claim 18, wherein said second step is carried out before said gate insulation film/gate electrode formation and first steps, in which a nitrogen diffusion layer is formed extending over the entire lateral length of said MIS-type field effect transistor.

23. A semiconductor device fabrication method as in claim 18 further comprising forming over said source and drain regions and over said gate electrode a film of silicide after said third step.

24. A semiconductor device fabrication method as in claim 15, wherein:
(a) a region for formation of a bipolar transistor is provided in said semiconductor substrate;
(b) said semiconductor device fabrication method further comprises:
forming a collector region for said bipolar transistor by doping an impurity of a first conductivity type into said bipolar transistor formation region;
forming a base region for said bipolar transistor by doping an impurity of a second conductivity type into said collector region;
(c) in said first step, an impurity of a first conductivity type is doped into said base region to form an emitter region for said bipolar transistor; and
(d) in said second step, nitrogen is doped into an area including at least a portion of said emitter region.

25. A semiconductor device fabrication method as in claim 15, wherein:
(a) a region for formation of a bipolar transistor is provided in said semiconductor substrate;
(b) said semiconductor device fabrication method further comprises:
forming a collector region for said bipolar transistor by doping an impurity of a first conductivity type into said bipolar transistor formation region;
forming an emitter region for said bipolar transistor by doping an impurity of a first conductivity type into said collector region after said first step;
(c) in said first step, a base region for said bipolar transistor is formed by doping an impurity of a second conductivity type into an area which is in said collector region and which encloses said emitter region;
(d) in said second step, nitrogen is doped into an area including at least a portion of said base region.

* * * * *

UNITED STATES PATENT AND TRADEMARK OFFICE
CERTIFICATE OF CORRECTION

PATENT NO. : 5,972,783
DATED : October 26, 1999
INVENTOR(S) : Arai et al.

It is certified that error appears in the above-indentified patent and that said Letters Patent is hereby corrected as shown below:

On the Cover page, in the "Other Publications" section:

After the last reference, insert --Kuroi et al., "Novel NICE (Nitrogen Implantation Into CMOS Gate Electrode and Source Drain) Structure for High Reliability and High Performance 0.25 µm Dual Gate CMOS", 5Dec93, pp. 325-328.--

In the Claims:

Claim 15, line 16, change "hither" to --higher--.

Signed and Sealed this

Sixth Day of March, 2001

*Attest:*

NICHOLAS P. GODICI

*Attesting Officer*        *Acting Director of the United States Patent and Trademark Office*